United States Patent  (10) Patent No.: US 8,514,191 B2
Wang et al.  (45) Date of Patent: Aug. 20, 2013

(54) TOUCH PANEL SENSING CIRCUIT

(75) Inventors: Hsin-Hao Wang, Tainan (TW); Yen-Lin Huang, Taipei (TW)

(73) Assignee: Orise Technology Co., Ltd., Hsinchu Science Park (TW)

( * ) Notice: Subject to any disclaimer, the term of this patent is extended or adjusted under 35 U.S.C. 154(b) by 520 days.

(21) Appl. No.: 12/923,996

(22) Filed: Oct. 20, 2010

(65) Prior Publication Data

US 2011/0102061 A1  May 5, 2011

(30) Foreign Application Priority Data

Oct. 30, 2009  (TW) .............................. 98136877 A

(51) Int. Cl.
*G06F 3/041* (2006.01)
(52) U.S. Cl.
USPC ......................................................... 345/173

(58) Field of Classification Search
USPC .................................. 345/173–178; 327/517
See application file for complete search history.

(56) References Cited

U.S. PATENT DOCUMENTS 7,863,966 B1 * 1/2011 Chuang et al. ................ 327/517
2008/0309622 A1 * 12/2008 Krah .............................. 345/173
2010/0085322 A1 * 4/2010 Mamba et al. ................ 345/173

* cited by examiner

*Primary Examiner* — Dennis Joseph
(74) *Attorney, Agent, or Firm* — Bacon & Thomas, PLLC

(57) ABSTRACT

A touch panel sensing circuit senses a voltage variation of a coupling capacitor formed between a first directional signal line and a second directional signal line separated from the first directional signal line by a dielectric when an object approaches. The sensing circuit eliminates the parasitic capacitance effect on the signal lines and rapidly accumulates charges for an amplifier in sensing to thereby increase the operational speed of the sensing circuit.

31 Claims, 15 Drawing Sheets

TOUCH PANEL SENSING CIRCUIT

BACKGROUND OF THE INVENTION

1. Field of the Invention

The present invention relates to the technical field of touch panels and, more particularly, to a touch panel sensing circuit.

2. Description of Related Art

FIG. 1 is a schematic diagram of an n×m touch panel, where n, m are each an integer larger than 1. As shown in FIG. 1, a pulse is inputted into a sensing line X1 110 at one direction (X axis), and charge is coupled to a sensing line Y1 130 at the other direction (Y axis) through mutual capacitance 120 between the sensing lines 110 and 130 in X-axis and Y-axis directions, respectively. Accordingly, a sensing circuit 140 can sense a charge variation on the sensing line Y1 to thereby produce a voltage signal Vo_1. The variation of the voltage signal Vo_1 is used to find the capacitance variation of the mutual capacitance 120 which can further determine whether an object approaches the position (X1, Y1) on the touch panel. Thus a sensing operation is performed on the touch panel.

FIG. 2 is a block diagram of a sensing circuit 140 disclosed in U.S. Pat. No. 6,452,514 granted to Philipp for a "Capacitive sensor and array". As shown in FIG. 2, the circuit includes a signal generator 210, a first driven electrode 220, a coupling capacitance 230, a second receiving electrode 240, a sampling switch 250, a charge integrator 260, an amplifier 270 and a reset switch 280. The coupling capacitance 230 is provided to induce the electric field change between the sensing lines in X and Y directions. The charge integrator 260 is a capacitor for performing integration.

The signal generator 210 is provided for producing a clock signal. The first driven electrode 220 is connected to the signal generator 210 in order to receive the clock signal. The second receiving electrode 240 is a sensing line in Y-axis direction. The operation of the sensing circuit 140 is essentially implemented by a clock control approach and uses the coupling capacitance 230 to couple the charges to the charge integrator 260, so that the amplifier 270 can use the charge integrator 260 in voltage detection.

However, such a sensing circuit 140 does not consider the parasitic capacitance (Cy or Cx) of sensing lines in X-axis direction or Y-axis direction. The coupling capacitance 230 is typically of the scale of several picofarads, but the parasitic capacitance (Cy or Cx) of a sensing line is up to tens of picofarads. Due to the parasitic capacitance effect (Cy or Cx), the coupling capacitance 230 and the charge integrator 260 have little coupling charge amount in division, resulting in producing a smaller variation to the output voltage Vout. Thus, the amplifier 270 is prone to have a detection problem. In addition, the divided voltage stored in the charge integrator 260 is expressed by a coefficient of $$\frac{Cxy}{Cs+Cxy},$$

which is smaller than one, so that the accumulated charge difference is reduced as the number of clock cycles increases. As a result, an additional number of clock cycles is required for obtaining the accumulated charge amount to be detected by the amplifier 270, which further reduces the sensing speed or sensitivity of the sensing circuit of the touch panel. Therefore, there still are problems existed in the conventional skill for sensing a touch on the touch panel, and accordingly it is desirable to provide an improved touch panel sensing circuit to mitigate and/or obviate the aforementioned problems.

SUMMARY OF THE INVENTION

The object of the present invention is to provide a touch panel sensing circuit, which replaces the prior circuit that performs the sampling and amplification only once with a sensing circuit that can accumulate and amplify charges and increase the accumulated charge difference as a number of clock cycles increase. In addition, the sensing circuit can avoid a sensing signal from being affected by the parasitic capacitance of the X-axis or Y-axis directional signal line in the prior art.

According to a feature of the invention, a touch panel sensing circuit is provided, which senses a voltage variation of a coupling capacitor formed between a first directional signal line and a second directional signal line separated from the first directional signal line by a dielectric when an object approaches. The touch panel sensing circuit includes an input voltage source, first to third voltage switches, a common voltage source, an amplifier, first to eighth switches and a first feedback capacitor. The input voltage source produces a plurality of periodic voltage cycles. The first voltage switch has a first terminal connected to the input voltage source and a second terminal connected to the first directional signal line. The common voltage source provides a DC common voltage. The second voltage switch has a first terminal connected to the common voltage source and a second terminal connected to the first directional signal line. The first switch has a first terminal connected to the second directional signal line. The amplifier has an inverting input terminal connected to a second terminal of the first switch. The second switch has a first terminal connected to the inverting input terminal of the amplifier. The third switch has a first terminal connected to a second terminal of the second switch and a second terminal connected to the common voltage source. The fourth switch has a first terminal connected to the inverting input terminal of the amplifier. The first feedback capacitor has a first terminal connected to a second terminal of the fourth switch. The fifth switch has a first terminal connected to a second terminal of the first feedback capacitor and a second terminal connected to an output terminal of the amplifier. The sixth switch has a first terminal connected to the input voltage source and a second terminal connected to the second terminal of the first feedback capacitor. The seventh switch has a first terminal connected to the second terminal of the fourth switch and a second terminal connected to the common voltage source. The eighth switch has a first terminal connected to the inverting input terminal of the amplifier and a second terminal connected to the output terminal of the amplifier. The third voltage switch has a first terminal connected to a non-inverting input terminal of the amplifier, a second terminal connected to the common voltage source and a third terminal connected to the input voltage source.

According to another feature of the invention, a touch panel sensing circuit is provided, which senses a voltage variation of a coupling capacitor formed between a first directional signal line and a second directional signal line separated from the first directional signal line by a dielectric when an object approaches. The touch panel sensing circuit includes an input voltage source, first to third voltage switches, a common voltage source, an amplifier, first to eighth switches and a first feedback capacitor. The input voltage source produces a plurality of periodic voltage cycles. The first voltage switch has a first terminal connected to the input voltage source and a second terminal connected to the first directional signal line.

The common voltage source provides a DC common voltage. The second voltage switch has a first terminal connected to the common voltage source and a second terminal connected to the first directional signal line. The first switch has a first terminal connected to the second directional signal line. The amplifier has an inverting input terminal connected to a second terminal of the first switch. The second switch has a first terminal connected to the inverting input terminal of the amplifier. The third switch has a first terminal connected to a second terminal of the second switch and a second terminal connected to the common voltage source. The fourth switch has a first terminal connected to the inverting input terminal of the amplifier. The first feedback capacitor has a first terminal connected to a second terminal of the fourth switch. The fifth switch has a first terminal connected to a second terminal of the first feedback capacitor and a second terminal connected to an output terminal of the amplifier. The sixth switch has a first terminal connected to the first directional signal line and a second terminal connected to the second terminal of the first feedback capacitor. The seventh switch has a first terminal connected to the second terminal of the fourth switch and a second terminal connected to the common voltage source. The eighth switch has a first terminal connected to the inverting input terminal of the amplifier and a second terminal connected to the output terminal of the amplifier. The third voltage switch has a first terminal connected to a non-inverting input terminal of the amplifier, a second terminal connected to the common voltage source and a third terminal connected to the input voltage source.

According to a further feature of the invention, a touch panel sensing circuit is provided, which senses a voltage variation of a coupling capacitor formed between a first directional signal line and a second directional signal line separated from the first directional signal line by a dielectric when an object approaches. The touch panel sensing circuit includes an input voltage source, first to third voltage switches, a common voltage source, an amplifier, first to fifth switches, seventh to eighth switches and a first feedback capacitor. The input voltage source produces a plurality of periodic voltage cycles. The first voltage switch has a first terminal connected to the input voltage source and a second terminal connected to the first directional signal line. The common voltage source provides a DC common voltage. The second voltage switch has a first terminal connected to the common voltage source and a second terminal connected to the first directional signal line. The first switch has a first terminal connected to the second directional signal line. The amplifier has an inverting input terminal connected to a second terminal of the first switch. The second switch has a first terminal connected to the inverting input terminal of the amplifier. The third switch has a first terminal connected to a second terminal of the second switch and a second terminal connected to the common voltage source. The fourth switch has a first terminal connected to the inverting input terminal of the amplifier. The first feedback capacitor has a first terminal connected to a second terminal of the fourth switch. The fifth switch has a first terminal connected to a second terminal of the first feedback capacitor and a second terminal connected to an output terminal of the amplifier. The seventh switch has a first terminal connected to the second terminal of the fourth switch and a second terminal connected to the common voltage source. The eighth switch has a first terminal connected to the inverting input terminal of the amplifier and a second terminal connected to the output terminal of the amplifier. The third voltage switch has a first terminal connected to a non-inverting input terminal of the amplifier, a second terminal connected to the common voltage source and a third terminal connected to the input voltage source.

Other objects, advantages, and novel features of the invention will become more apparent from the following detailed description when taken in conjunction with the accompanying drawings.

DETAILED DESCRIPTION OF THE PREFERRED EMBODIMENT

Figure 1:
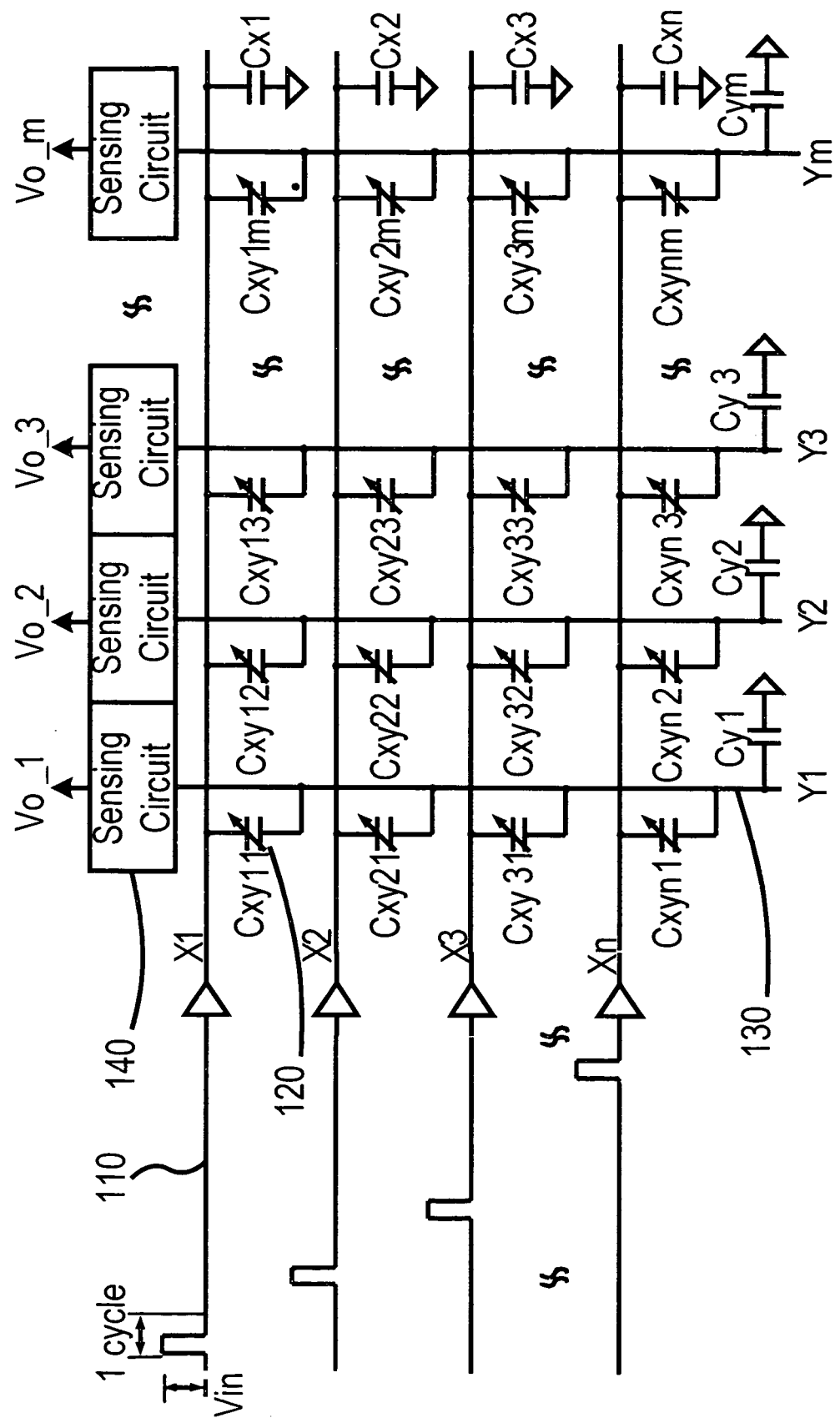
FIG. 1 is a schematic diagram of a typical n×m touch panel.
Figure 2:
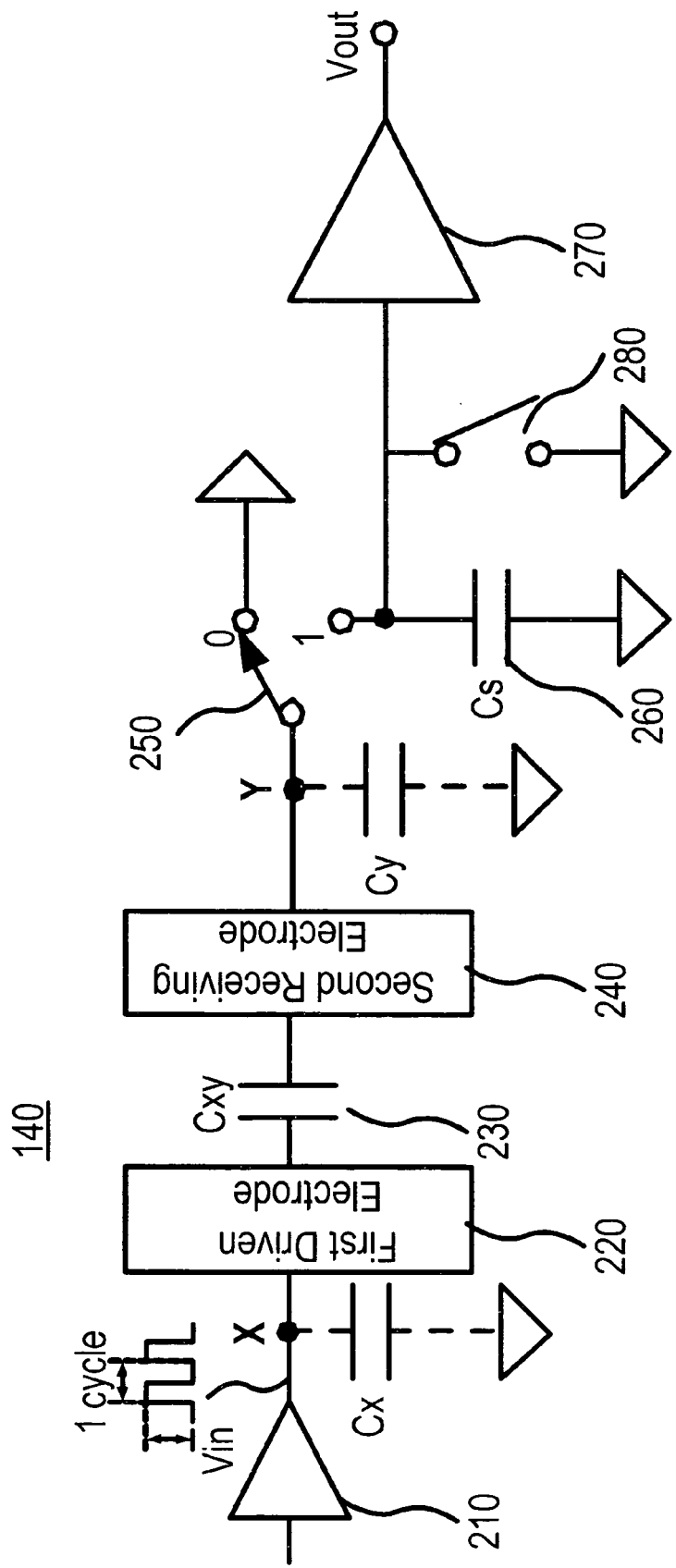
FIG. 2 is a block diagram of a sensing circuit of a typical touch panel.
Figure 3:
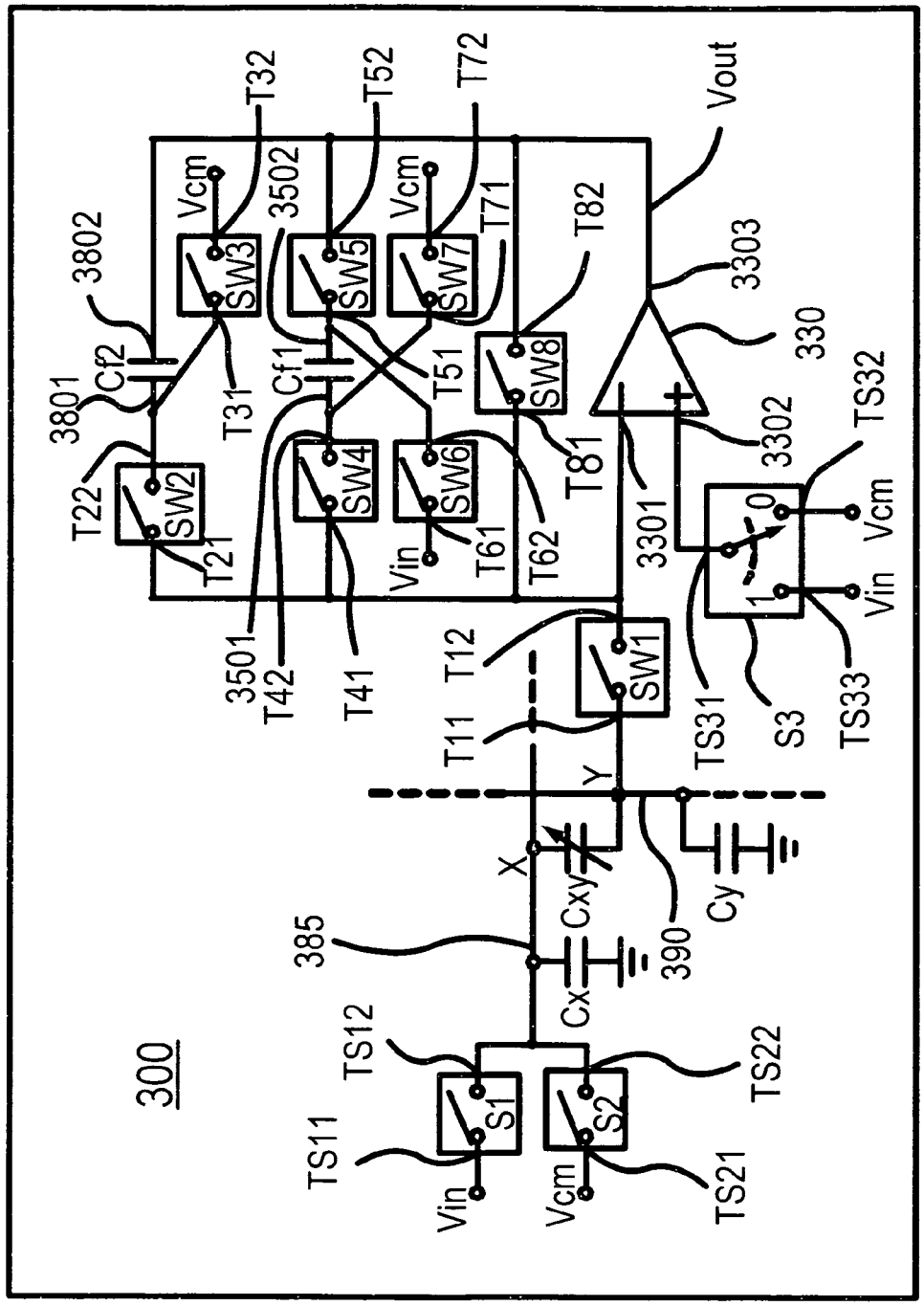
FIG. 3 is a block diagram of a sensing circuit for a touch panel according to an embodiment of the invention.

FIG. 3 is a block diagram of a touch panel sensing circuit 300 in accordance with a preferred embodiment of the present invention, which is applied for a touch panel. In FIG. 3, the touch panel, as known to those skill in the art, has a plurality of first directional (X-directional) signal lines and a plurality of second directional (Y-directional) signal lines. When an object approaches, the sensing circuit 300 senses the voltage of a coupling capacitor Cxy. The coupling capacitor is formed between an x-th signal line 385 in a first direction (X direction) and a y-th signal line 390 in a second direction (Y direction). The signal lines 385 and 390 are separated by a dielectric (not shown). The first directional signal line 385 has a parasitic capacitor Cx, and the second directional signal line 390 has a parasitic capacitor Cy. The capacitors Cx, Cy and Cxy are not physically existed capacitors, and instead they are produced by inducing of the first and second directional signal lines 385 and 390. The coupling capacitor Cxy can function as a variable capacitor, and its capacitance value is determined as an object approaches or presses the touch panel.

The sensing circuit 300 is based on the variation of the voltage signal to determine the magnitude variation of the coupling capacitor Cxy, and further uses the magnitude variation of the coupling capacitor Cxy to determine whether an object approaches the position (x, y) where the x-th signal line in the first direction intersects the y-th signal line in the second direction on the touch panel. Accordingly, touching on the touch panel is detected.

The sensing circuit 300 includes an input voltage source Vin, a first voltage switch S1, a common voltage source Vcm, a second voltage switch S2, a first switch SW1, an amplifier 330, a second switch SW2, a third switch SW3, a fourth switch SW4, a first feedback capacitor Cf1, a fifth switch SW5, a sixth switch SW6, a seventh switch SW7, an eighth switch SW8, a third voltage switch S3 and a second feedback capacitor Cf2.

The input voltage source Vin produces a plurality of periodic voltage cycles with sine, cosine or pulse waveform.

The first voltage switch S1 has a first terminal TS11 connected to the input voltage source Vin and a second terminal TS12 connected to the first directional signal line 385.

The common voltage source Vcm provides a DC common voltage and an AC ground. The DC common voltage biases the amplifier 330 to the operating point and is set to zero for the purpose of convenient illustration.

The second voltage switch S2 has a first terminal TS21 connected to the common voltage source Vcm and a second terminal TS22 connected to the first directional signal line 385.

The first switch SW1 has a first terminal T11 connected to the second directional signal line 390. The amplifier 330 has an inverting input terminal 3301 connected to a second terminal T12 of the first switch SW1. The second switch SW2 has a first terminal T21 connected to the inverting input terminal 3301 of the amplifier 330. The third switch SW3 has a first terminal T31 connected to a second terminal T22 of the second switch SW2 and a second terminal T32 connected to the common voltage source Vcm.

The fourth switch SW4 has a first terminal T41 connected to the inverting input terminal 3301 of the amplifier 330. The first feedback capacitor Cf1 has a first terminal 3501 connected to a second terminal T42 of the fourth switch SW4. The fifth switch SW5 has a first terminal T51 connected to a second terminal 3502 of the first feedback capacitor Cf1 and a second terminal T52 connected to an output terminal 3303 of the amplifier 330. The sixth switch SW6 has a first terminal T61 connected to the input voltage source Vin and a second terminal T62 connected to the second terminal 3502 of the first feedback capacitor Cf1.

The seventh switch SW7 has a first terminal T71 connected to the second terminal T42 of the fourth switch SW4 and a second terminal T72 connected to the common voltage source Vcm. The eighth switch SW8 has a first terminal T81 connected to the inverting input terminal 3301 of the amplifier 330 and a second terminal T82 connected to the output terminal 3303 of the amplifier 330. The third voltage switch S3 has a first terminal TS31 connected to a non-inverting input terminal 3302 of the amplifier 330, a second terminal TS32 connected to the common voltage source Vcm and a third terminal TS33 connected to the input voltage source Vin. The second feedback capacitor Cf1 has a first terminal 3801 connected to the second terminal T22 of the second switch SW2 and a second terminal 3802 connected to the output terminal 3303 of the amplifier 330.

The sensing circuit 300 is able to form an initialization cycle and multiple charge accumulation cycles by switching the first to eighth switches SW1-SW8 and the first to third voltage switches S1-S3, and speed up the charge accumulation by means of the feedback capacitors Cf1 and Cf2.

Figure 4:
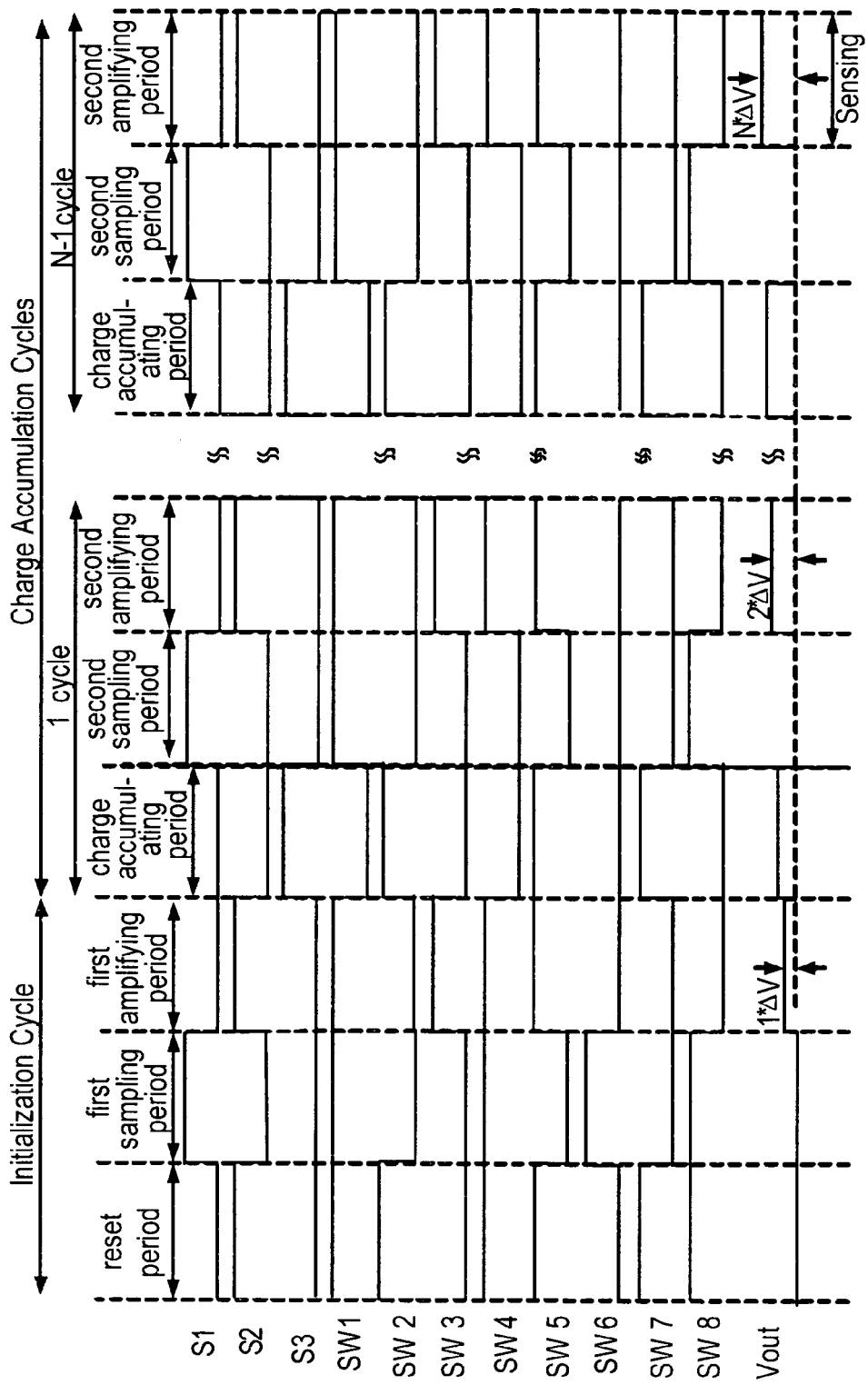
FIG. 4 is a timing of the sensing circuit of FIG. 3 according to an embodiment of the invention.

FIG. 4 is a timing of the sensing circuit 300 of FIG. 3 according to an embodiment of the invention. The timing includes an initialization cycle and multiple charge accumulation cycles. The initialization cycle includes a reset period, a first sampling period and a first amplifying period. Each charge accumulation cycle includes a charge accumulating period, a second sampling period and a second amplifying period.

As shown in FIG. 4, the sensing circuit 300 at the second amplifying period in the (N−1)-th charge accumulation cycle outputs an output voltage of N×ΔV through the output terminal 3303, for $$\Delta V = Vin \times \frac{Cf1 + Cxy}{Cf1},$$

where Vin indicates a voltage of the input voltage source (Vin), Cf1 indicates a capacitance value of the first feedback capacitor (Cf1), and Cxy indicates a capacitance value of the coupling capacitor (Cxy).

Figure 5:
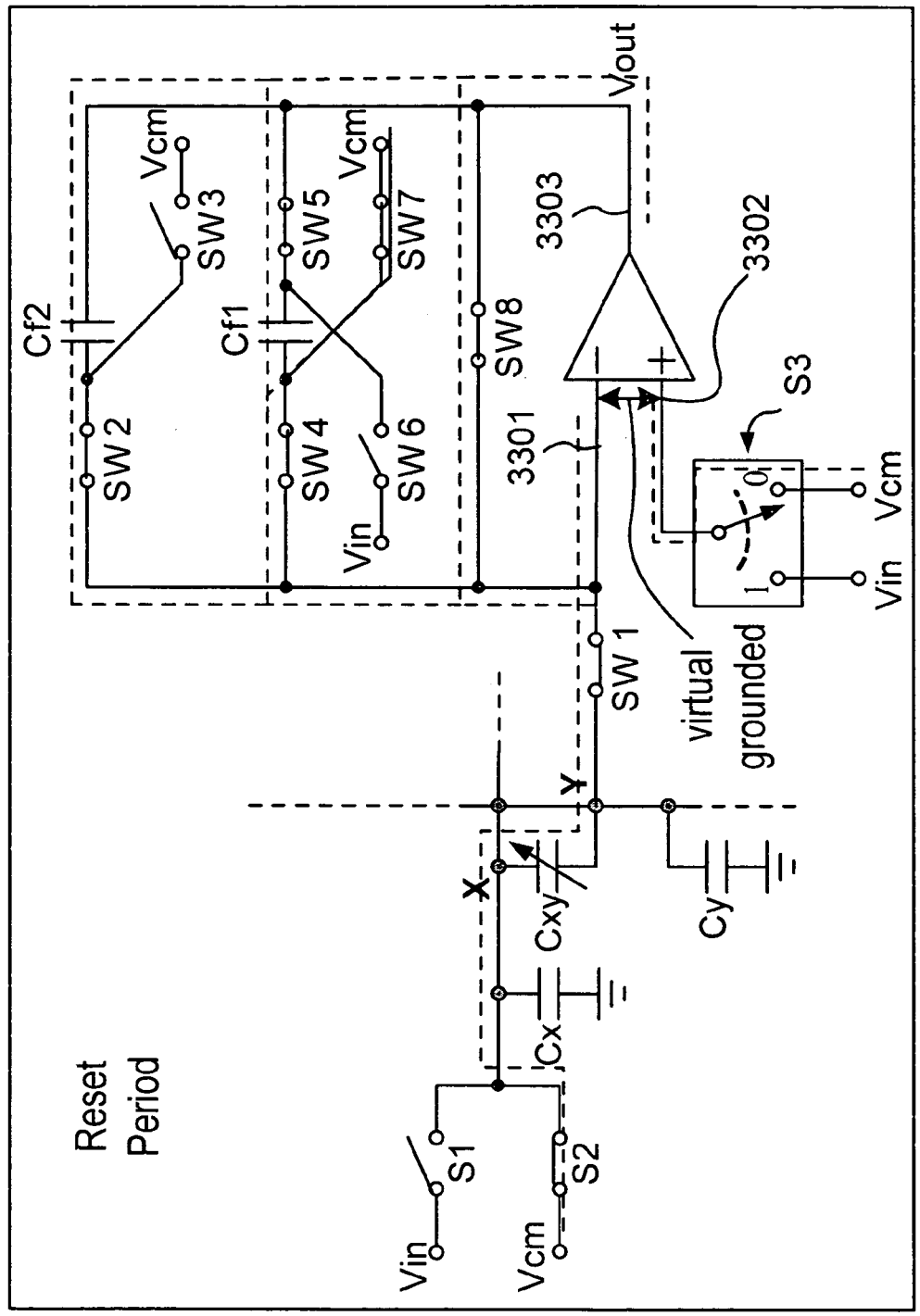
FIG. 5 is an equivalent circuit at a reset period according to an embodiment of the invention.

As shown in FIG. 4, at the reset period, the first voltage switch S1 is off, the second voltage switch S2 is on, and the third voltage switch S3 connects its first terminal TS31 to the common voltage source Vcm. In this case, the switches SW1, SW2, SW4, SW5, SW7 and SW8 are on, and the switches SW3 and SW6 are off. FIG. 5 is an equivalent circuit at the reset period according to an embodiment of the invention.

For convenient analysis, the DC common voltage is regarded as zero. As shown in FIG. 5, at the reset period, the coupling capacitor Cxy, the first feedback capacitor Cf1 and the second feedback capacitor Cf2 are reset, i.e., the charge thereon is discharged. Since the eighth switch SW8 is on, a negative feedback is formed, and the inverting and non-inverting input terminals 3301 and 3302 of the amplifier 330 form a virtual ground. Accordingly, the voltage applied to the coupling capacitor Cxy, the first feedback capacitor Cf1, the second feedback capacitor Cf2 and the parasitic capacitors Cx and Cy is 0V. Thus, the capacitors Cxy, Cf1, Cf2, Cx and Cy are reset, i.e., the charge thereon is discharged.

As shown in FIG. 4, at the first sampling period, the first voltage switch S1 becomes on, the second voltage switch S2 becomes off, and the third voltage switch S3 connects its first terminal TS31 to the common voltage source Vcm. In this case, the switches SW1, SW4, SW6 and SW8 are on, and the switches SW2, SW3, SW5 and SW7 are off.

Figure 6:
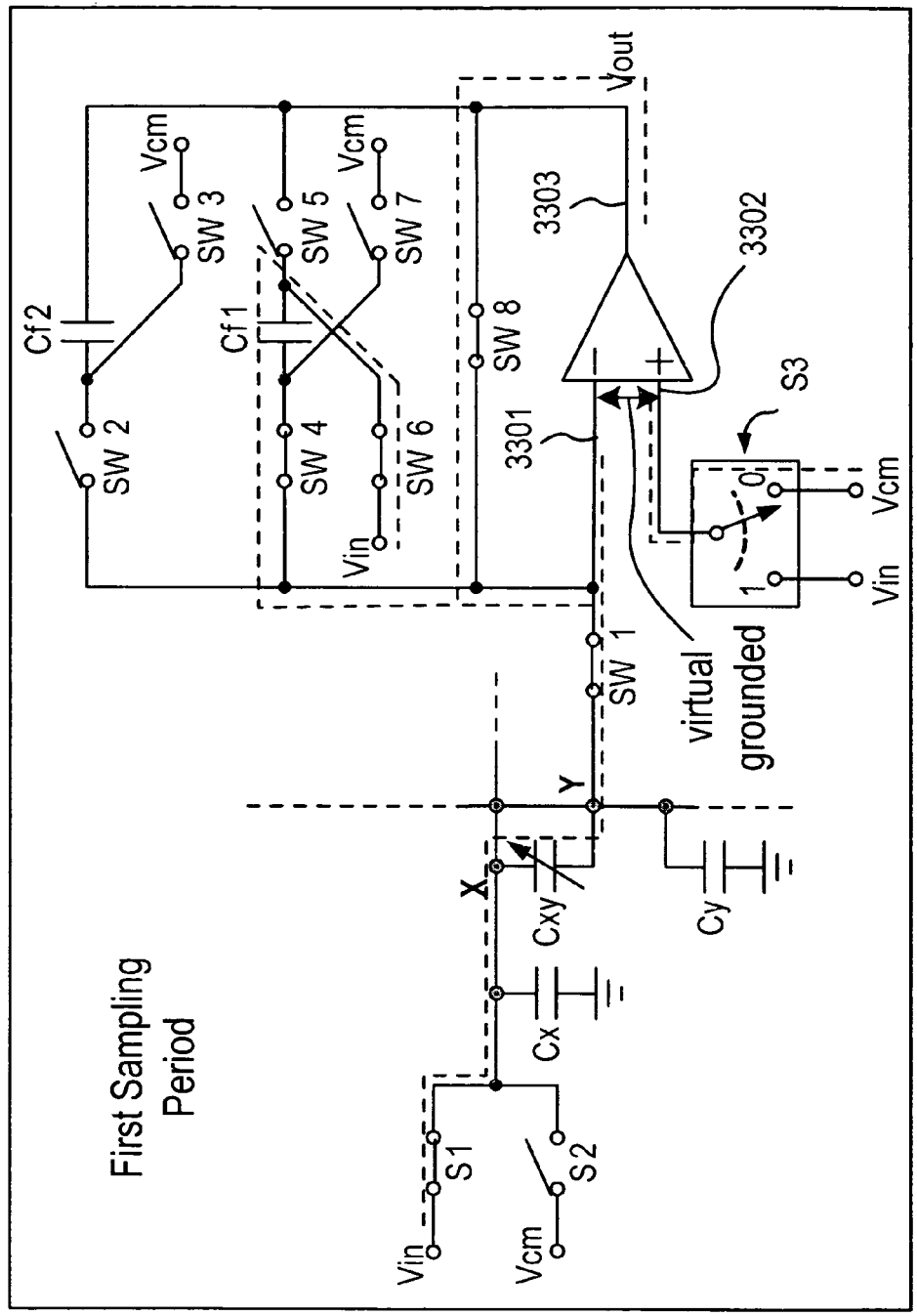
FIG. 6 is an equivalent circuit at a first sampling period according to an embodiment of the invention.

FIG. 6 is an equivalent circuit at the first sampling period according to an embodiment of the invention. As shown in FIG. 6, the input voltage source Vin charges the coupling capacitor Cxy and the first feedback capacitor Cf1, and the amplifier 330 functions as a unit gain buffer. In this case, the parasitic capacitor Cy is maintained in a state as same as that at the reset period since the inverting and non-inverting input terminals 3301 and 3302 of the amplifier 330 form a virtual ground.

As shown in FIG. 4, at the first amplifying period, the first voltage switch S1 becomes off, the second voltage switch S2 becomes on, and the third voltage switch S3 connects its first terminal TS31 to the common voltage source Vcm. In this case, the switches SW1, SW3, SW4 and SW5 are on, and the switches SW2, SW6, SW7 and SW8 are off.

Figure 7:
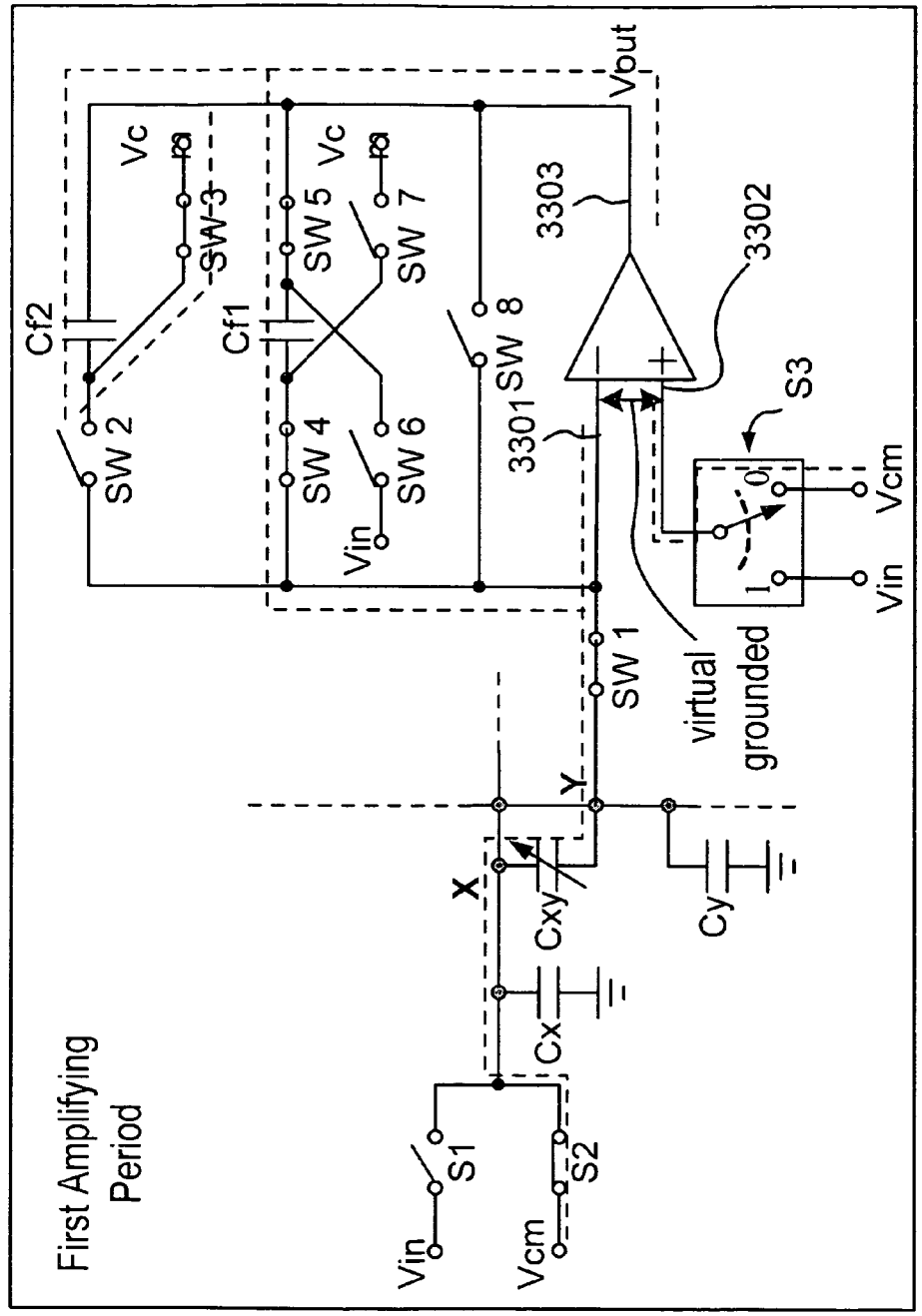
FIG. 7 is an equivalent circuit at a first amplifying period according to an embodiment of the invention.

FIG. 7 is an equivalent circuit at the first amplifying period according to an embodiment of the invention. As shown in FIG. 7, the inverting and non-inverting input terminals 3301 and 3302 of the amplifier 330 form a virtual ground, and the charge on the coupling capacitor Cxy is added to the first feedback capacitor Cf1 for accumulation. In this case, since the second feedback capacitor Cf2 is connected to the output terminal 3303 of the amplifier 330, the voltage on the output terminal 3303 of the amplifier 330 and on the second feedback capacitor Cf2 can be expressed as:

$$V_{out} = Vin * \frac{Cf1 + Cxy}{Cf1} \equiv V_0.$$

In addition, the parasitic capacitor Cy of the second directional signal line 390 is maintained the same since the inverting and non-inverting input terminals 3301 and 3302 of the amplifier 330 form a virtual ground. Thus, the sensing signal is not affected by the parasitic capacitor Cy of the second directional signal line 390.

As shown in FIG. 4, at the charge accumulating period in a first charge accumulation cycle, the first voltage switch S1 is off, the second voltage switch S2 becomes off, and the third voltage switch S3 connects its first terminal TS31 to the input voltage source Vin. In this case, the switches SW2, SW5 and SW7 are on, and the switches SW1, SW3, SW4, SW6 and SW8 are off.

Figure 8:
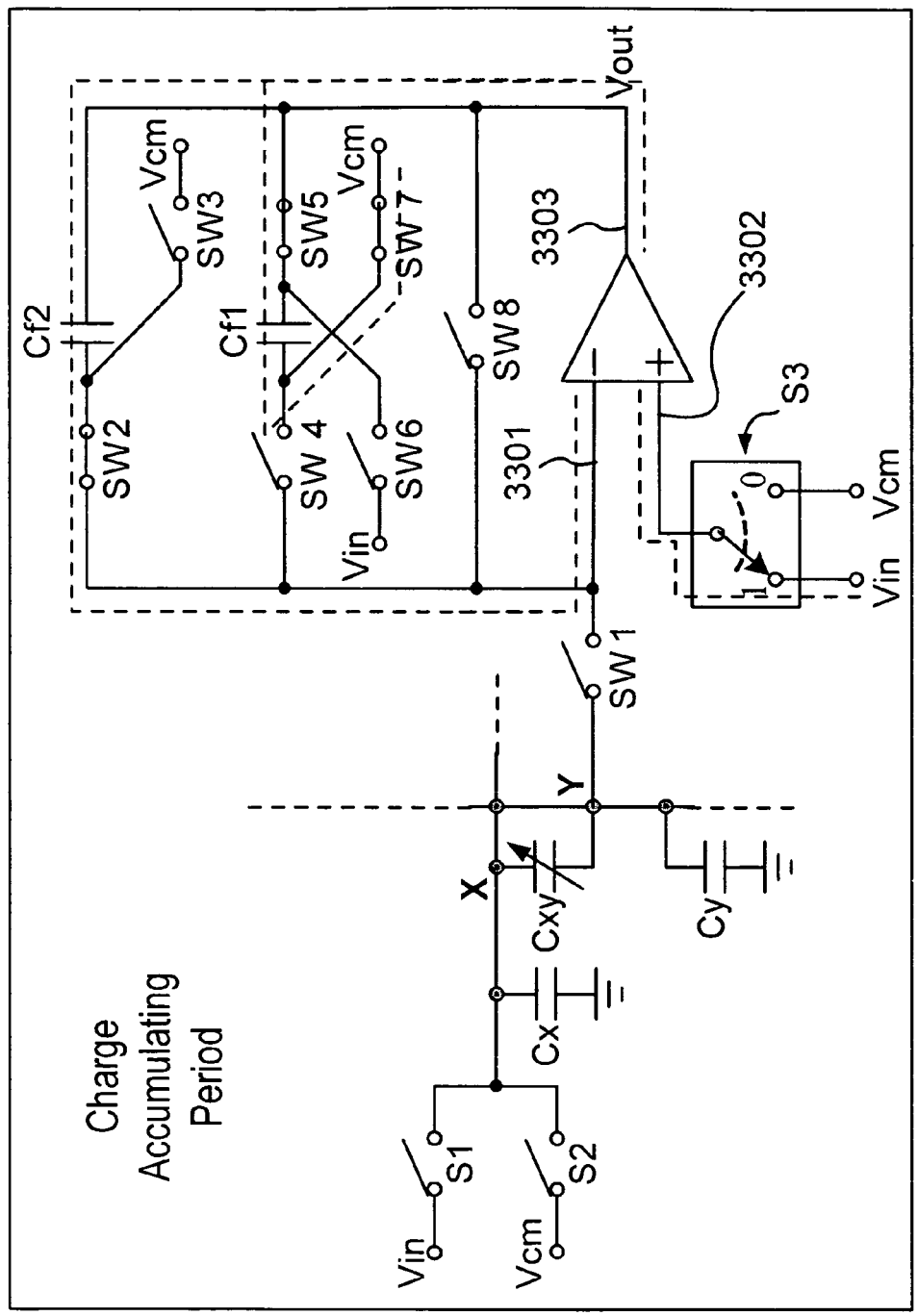
FIG. 8 is an equivalent circuit at a charge accumulating period according to an embodiment of the invention.

FIG. 8 is an equivalent circuit at the charge accumulating period in the first charge accumulation cycle according to an embodiment of the invention. As shown in FIG. 8, the feedback path is switched from the first feedback capacitor Cf1 to the second feedback capacitor Cf2, and the input voltage source Vin is inputted into the non-inverting input terminal 3302 of the amplifier 330 to thereby add the voltage of the input voltage source Vin to the second feedback capacitor Cf2. In this case, the first feedback capacitor Cf1 is connected to the output terminal 3303 of the amplifier 330 in order to store the accumulated charge in the next cycle. The voltage on the output terminal 3303 of the amplifier 330 and on the first feedback capacitor Cf1 can be expressed as:

$$V_{out} = Vin + V_0 = Vin + Vin * \frac{Cf1 + Cxy}{Cf1} \equiv V_1,$$

where $V_0$ indicates the voltage on the second feedback capacitor Cf2 at the first amplifying period.

As shown in FIG. 4, at the second sampling period in the first charge accumulation cycle, the first voltage switch S1 becomes on, the second voltage switch S2 is off, and the third voltage switch S3 connects its first terminal TS31 to the common voltage source Vcm. In this case, the switches SW1 and SW8 are on, and the switches SW2 to SW7 are off.

Figure 9:
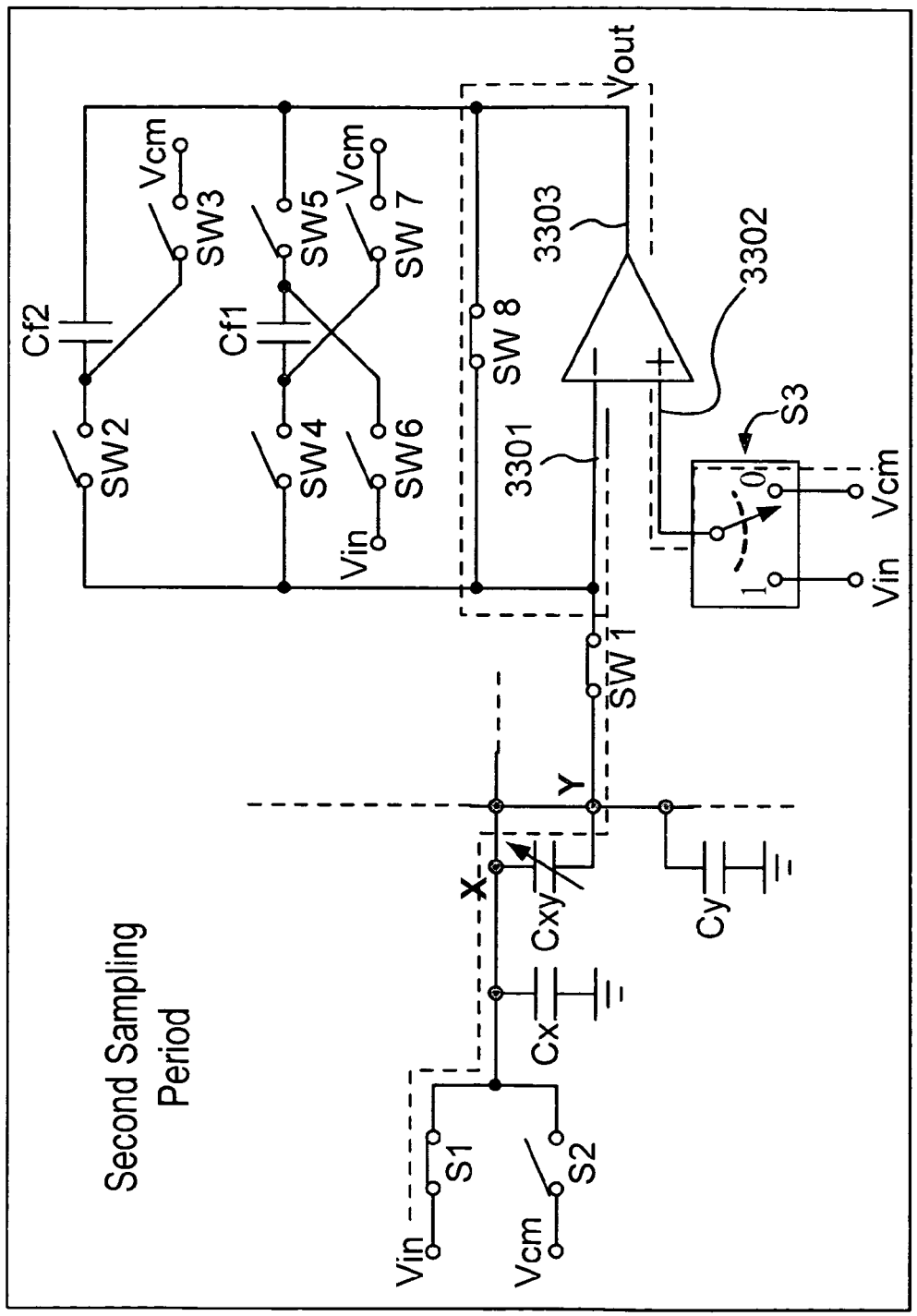
FIG. 9 is an equivalent circuit at a second sampling period according to an embodiment of the invention.

FIG. 9 is an equivalent circuit at the second sampling period in the first charge accumulation cycle according to an embodiment of the invention. As shown in FIG. 9, the input voltage source Vin charges the coupling capacitor Cxy, and the amplifier 330 functions as a unit gain buffer. Accordingly, the parasitic capacitor Cy is maintained the same since the inverting and non-inverting input terminals 3301 and 3302 of the amplifier 330 form a virtual ground. In this case, the voltage Vout on the output terminal 3303 of the amplifier 330 and on the second feedback capacitor Cf2 equals to the voltage Vcm.

As shown in FIG. 4, at the second amplifying period in the first charge accumulation cycle, the first voltage switch S1 becomes off, the second voltage switch S2 becomes on, and the third voltage switch S3 connects its first terminal TS31 to the common voltage source Vcm. In this case, the switches SW1, SW3, SW4 and SW5 are on, and the switches SW2, SW6, SW7 and SW8 are off.

Figure 10:
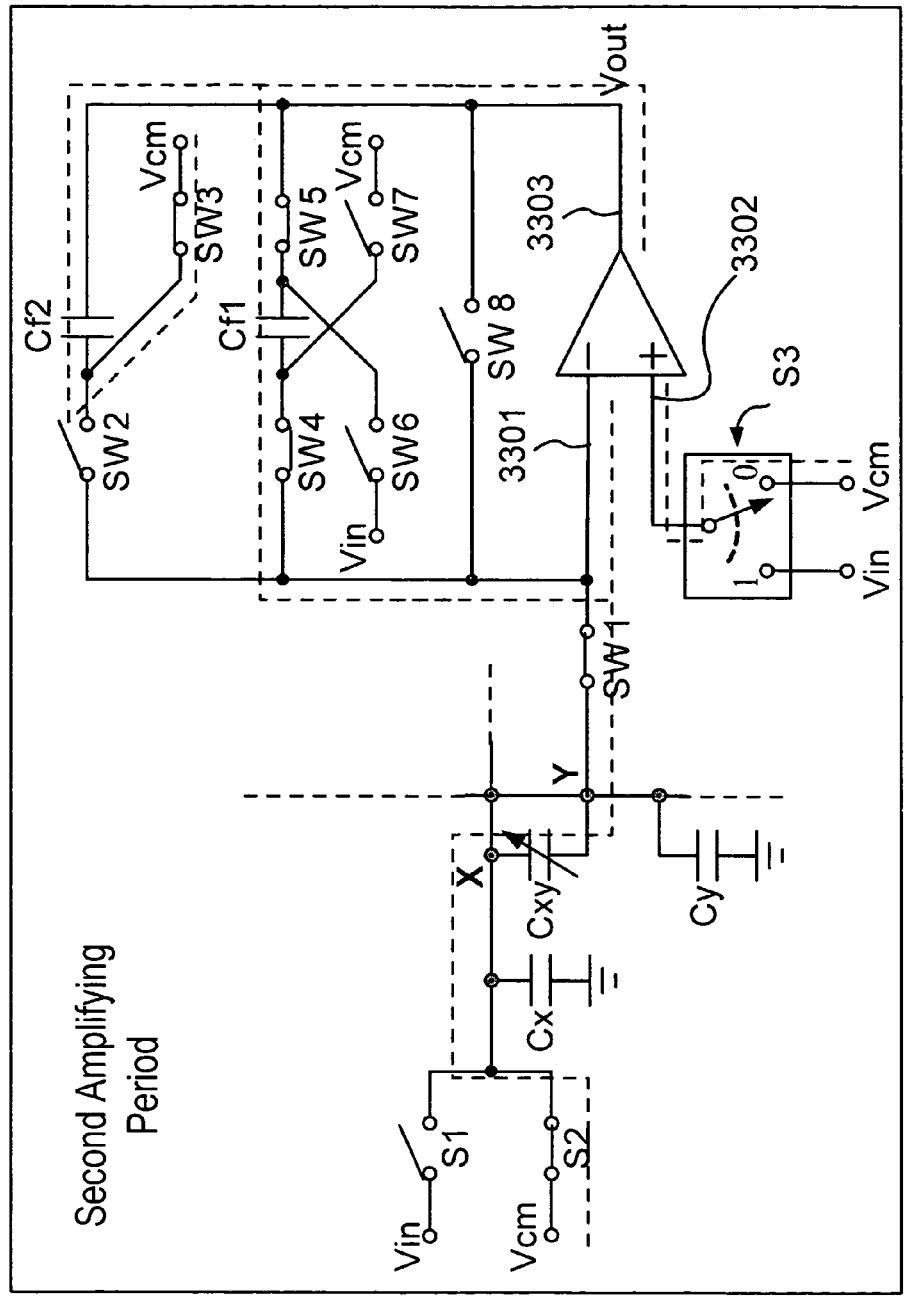
FIG. 10 is an equivalent circuit at a second amplifying period according to an embodiment of the invention.

FIG. 10 is an equivalent circuit at the second amplifying period in the first charge accumulation cycle according to an embodiment of the invention. As shown in FIG. 10, the inverting and non-inverting input terminals 3301 and 3302 of the amplifier 330 form a virtual ground, and the charge on the coupling capacitor Cxy is added to the first feedback capacitor Cf1 for accumulation. In this case, since the second feedback capacitor Cf2 is connected to the output terminal 3303 of the amplifier 330, a voltage Vout on the output terminal 3303 of the amplifier 330 and on the second feedback capacitor Cf2 can be expressed as:

$$Cxy * Vin + V_1 * Cf1 = Cf1 * V_{out},$$

$$\therefore V_{out} = Vin * \frac{Cxy}{Cf1} + V_1 = Vin * \frac{Cxy}{Cf1} + Vin + Vin * \frac{Cf1 + Cxy}{Cf1},$$

$$= 2 * Vin * \frac{Cf1 + Cxy}{Cf1} \equiv 2\Delta V \equiv V_2,$$

where a feedback factor $$A = \frac{Cf1 + Cxy}{Cf1}.$$

The amplifier 330 can have a higher feedback factor at a closed loop gain, and the accumulated charge difference is increased as a number of clock cycles are increased.

Thus, the voltage on the output terminal 3303 of the amplifier 330 at the end of the first charge accumulation cycle is shown. Further, the voltage Vout on the output terminal 3303 of the amplifier 330 at the charge accumulating period in the second charge accumulation cycle can be expressed as:

$$V_{out} = Vin + V_2 \equiv V_3.$$

In the second charge accumulation cycle, the voltage Vout on the output terminal 3303 of the amplifier 330 at the second sampling period equals to Vcm, and the voltage Vout at the second amplifying period can be expressed as:

$$Cxy * Vin + V_3 * Cf1 = Cf1 * V_{out},$$

$$\therefore V_{out} = Vin * \frac{Cxy}{Cf1} + V_3 = 3 * Vin * \frac{Cf1 + Cxy}{Cf1} = 3\Delta V \equiv V_4.$$

Similarly, the amplifier 330 at the end of the (N−1)-th charge accumulation cycle outputs a voltage Vout=N×ΔV through the output terminal 3303.

As cited, the sensing circuit 300 uses the first and second feedback capacitors Cf1 and Cf2, which have respectively a smaller capacitance value, to detect the variation of the coupling capacitor Cxy. Namely, when an object approaches or contacts a touching element on the touch panel, the capacitance value of the coupling capacitor Cxy is changed (by several picofarads) to thereby make the output terminal 3303 of the amplifier 330 produce a respective voltage variation. The voltage variation is amplified and accumulated to thereby reduce the required sensing time and simplify the digital signal processing. The signal to noise ration (SNR) is effectively increased. In addition, by means of switching the first to eighth switches SW1-SW8 and the first to third voltage switches S1-S3 and virtually grounding the amplifier 330, the effect of the parasitic capacitor Cy present on the second directional signal line 390 can be canceled to avoid the sensing circuit 300 from being affected by the accumulated voltage variation.

The invention can operate the charge accumulation quicker than the prior art since switching the first to eighth switches SW1-SW8 and the first to third voltage switches S1-S3 and virtually grounding the feedback capacitors Cf1, Cf2 and the amplifier 330 are used. When the number of clock cycles increases, the induced charge is accumulated and increased by multiple times to further increase the operating speed of the sensing circuit 300. Further, the feedback capacitors Cf1 and Cf2 are used to allow a smaller area design to thereby save the required area and reduce the power consumption of the chips.

Figure 11:
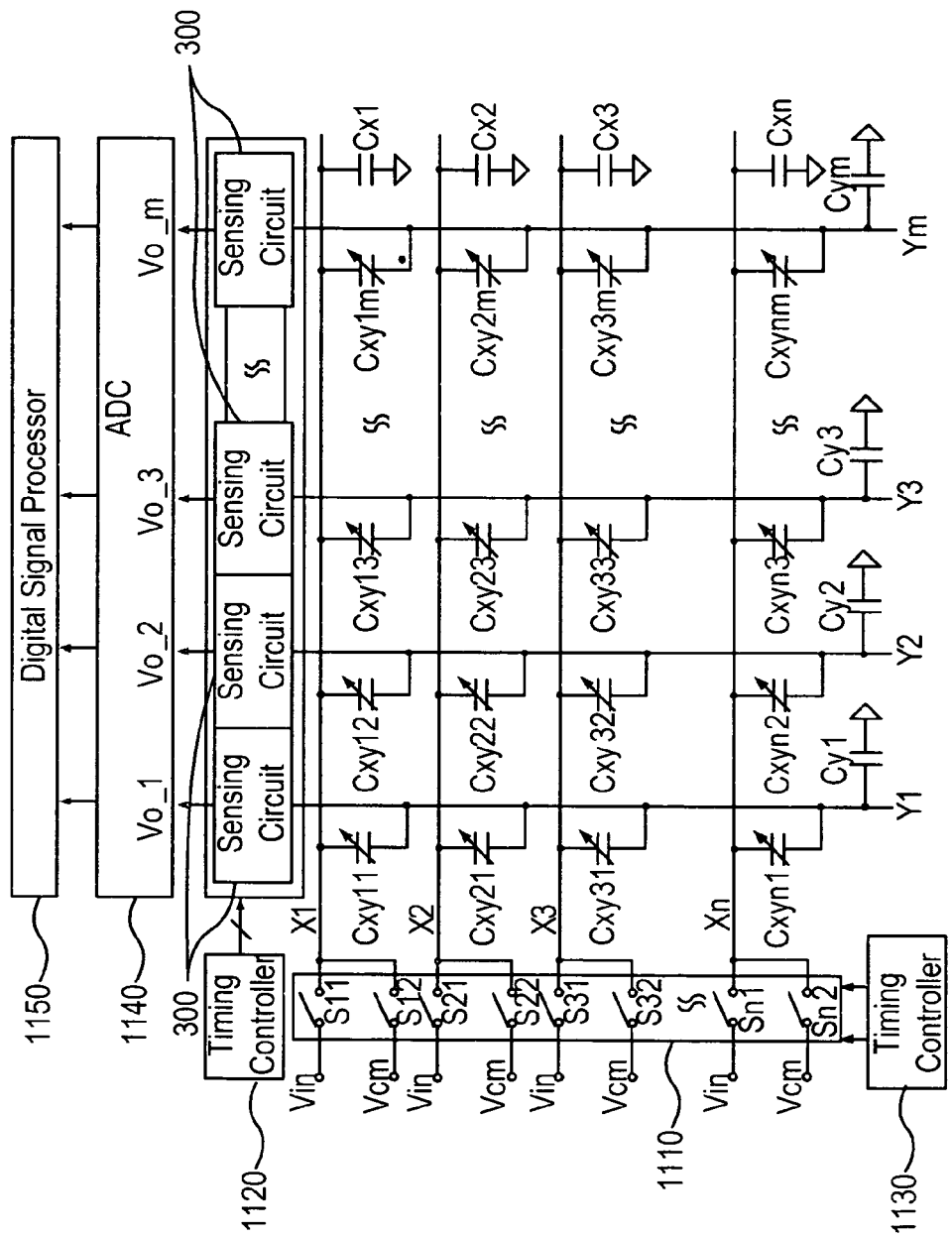
FIG. 11 is a schematic diagram of an application of a sensing circuit for a touch panel according to an embodiment of the invention.

FIG. 11 is a schematic diagram of an application of the sensing circuit 300 for a touch panel. As shown in FIG. 11, an X directional signal line switch 1110 essentially controls a set of input voltages Vin and a set of reference voltages Vcm (common voltage sources) or the ground, and multiple sensing circuits essentially sense the Y directional voltages. The timing controller 1130 for the switch 1110 and the timing controller 1120 for the sensing circuits are used to control the clock for accumulating and amplifying the sensed voltage variations.

At each time in detection, the timing controller 1120 controls the first to eighth switches SW1-SW8 and the third voltage switch, and the timing controller 1130 controls the input voltage of an X directional signal line, thereby producing a plurality of clock signals on the X directional signal line and obtaining m accumulated voltage variations by the Y directional sensing circuits 300, respectively, through the variations of the coupling capacitors Cxy between the X and Y directional signal lines. The obtained voltages are changed into a digital code by an analog to digital converter (ADC) 1140. The digital signal processor 1150 thereby determines whether an object approaches or a touching element is touched based on the digital code. The above procedure is performed on the input signals of all X directional signal lines to thereby obtain n×m voltage variations. The voltage variations Vo_1 to Vo_m are used to determine whether the object approaches or the touching element is touched.

Figure 12:
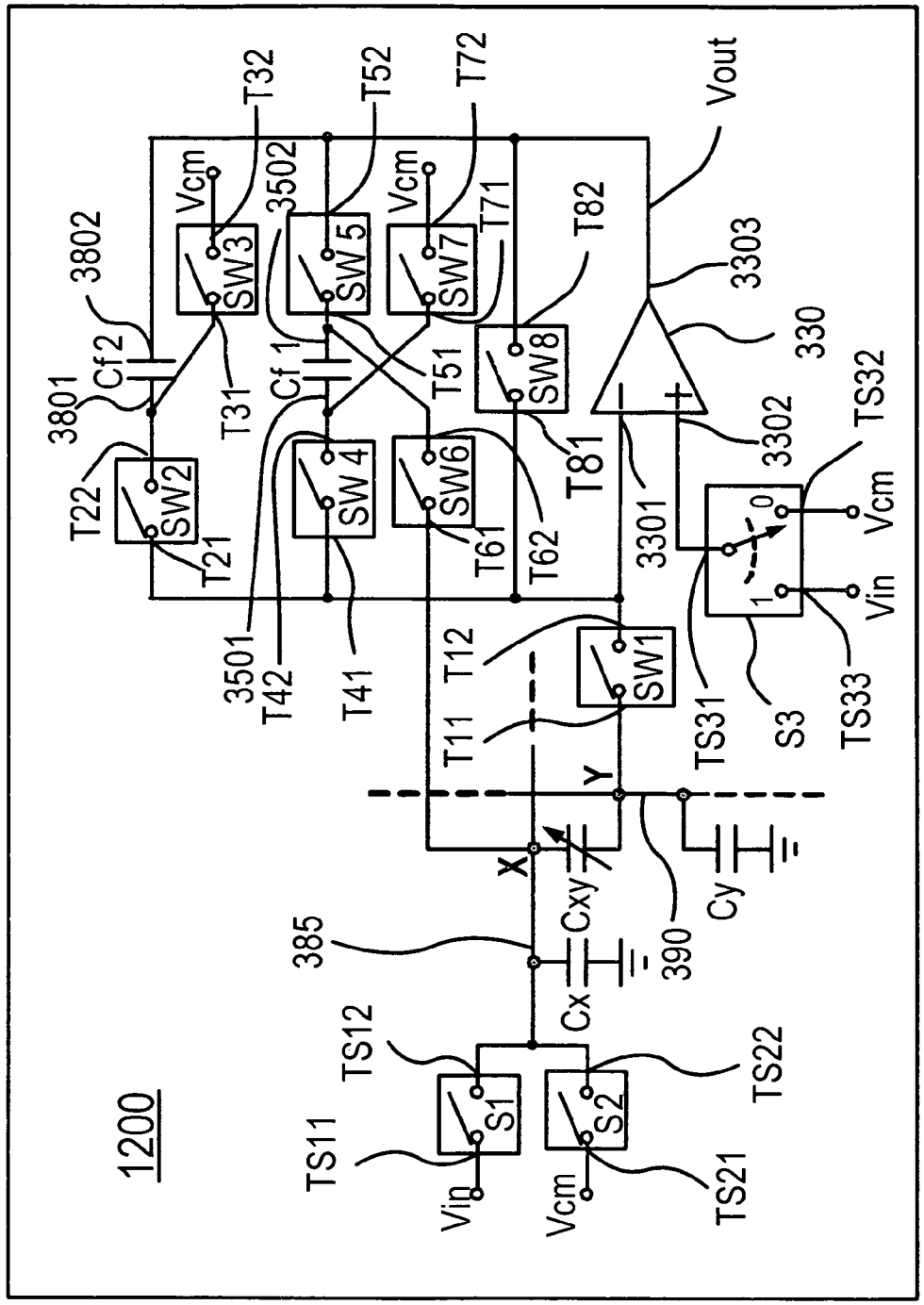
FIG. 12 is a block diagram of a sensing circuit for a touch panel according to another embodiment of the invention.

FIG. 12 is a block diagram of a sensing circuit 1200 for a touch panel according to a second embodiment of the invention. In FIG. 12, the sensing circuit 1200 includes an input voltage source Vin, a first voltage switch S1, a common voltage source Vcm, a second voltage switch S2, a first switch SW1, an amplifier 330, a second switch SW2, a third switch SW3, a fourth switch SW4, a first feedback capacitor Cf1, a fifth switch SW5, a sixth switch SW6, a seventh switch SW7, an eighth switch SW8, a third voltage switch S3 and a second feedback capacitor Cf2.

The sensing circuit 1200 of FIG. 12 is similar to that of FIG. 3 except that a first terminal T61 of the sixth switch SW6 is connected to a first directional (X-directional) signal line 385 in FIG. 12, other than to Vin in FIG. 3. Namely, in this embodiment, the first voltage switch S1 has a first terminal TS11 connected to the input voltage source Vin and a second terminal TS12 connected to the first directional signal line 385. The second voltage switch S2 has a first terminal TS21 connected to the common voltage source Vcm and a second terminal TS22 connected to the first directional signal line 385. The first switch SW1 has a first terminal T11 connected to a second directional (Y-directional) signal line 390. The amplifier 330 has an inverting input terminal 3301 connected to a second terminal T12 of the first switch SW1. The second switch SW2 has a first terminal T21 connected to the inverting input terminal 3301 of the amplifier 330. The third switch SW3 has a first terminal T31 connected to a second terminal T22 of the second switch SW2 and a second terminal T32 connected to the common voltage source Vcm. The fourth switch SW4 has a first terminal T41 connected to the inverting input terminal 3301 of the amplifier 330. The first feedback capacitor Cf1 has a first terminal 3501 connected to a second terminal T42 of the fourth switch SW4. The fifth switch SW5 has a first terminal T51 connected to a second terminal 3502 of the first feedback capacitor Cf1 and a second terminal T52 connected to an output terminal 3303 of the amplifier 330. The sixth switch SW6 has a first terminal T61 connected to the first directional signal line 385 and a second terminal T62 connected to the second terminal 3502 of the first feedback capacitor Cf1. The seventh switch SW7 has a first terminal T71 connected to the second terminal T42 of the fourth switch SW4 and a second terminal T72 connected to the common voltage source Vcm. The eighth switch SW8 has a first terminal T81 connected to the inverting input terminal 3301 of the amplifier 330 and a second terminal T82 connected to the output terminal 3303 of the amplifier 330. The third voltage switch S3 has a first terminal TS31 connected to a non-inverting input terminal 3302 of the amplifier 330, a second terminal TS32 connected to the common voltage source Vcm and a third terminal TS33 connected to the input voltage source Vin. The second feedback capacitor Cf2 has a first terminal 3801 connected to the second terminal T22 of the second switch SW2 and a second terminal 3802 connected to the output terminal 3303 of the amplifier 330.

Figure 13:
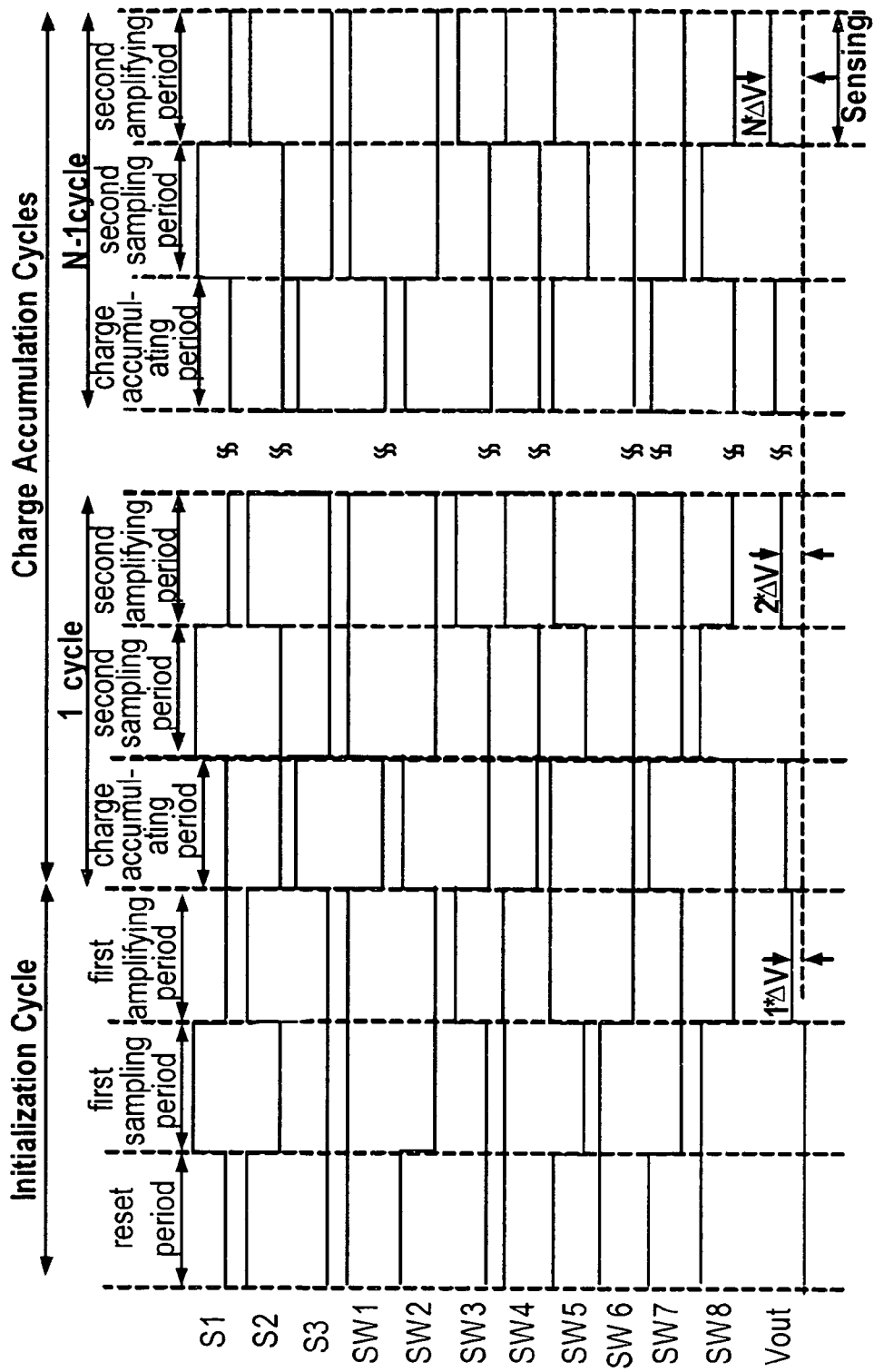
FIG. 13 is a timing of the sensing circuit of FIG. 12 according to another embodiment of the invention.

FIG. 13 is a timing of the sensing circuit 1200 of FIG. 12 according to the second embodiment of the invention, which is similar to that of FIG. 4. In this embodiment, the timing includes an initialization cycle and multiple charge accumulation cycles. The initialization cycle includes a reset period, a first sampling period and a first amplifying period. Each charge accumulation cycle includes a charge accumulating period, a second sampling period and a second amplifying period. The sensing circuit 1200 at the second amplifying period in the (N−1)-th charge accumulation cycle outputs an output voltage of N×ΔV through the output terminal 3303, where $$\Delta V = Vin \times \frac{Cf1 + Cxy}{Cf1},$$

Vin indicates a voltage of the input voltage source (Vin), Cf1 indicates a capacitance value of the first feedback capacitor (Cf1), and Cxy indicates a capacitance value of the coupling capacitor (Cxy).

Figure 14:
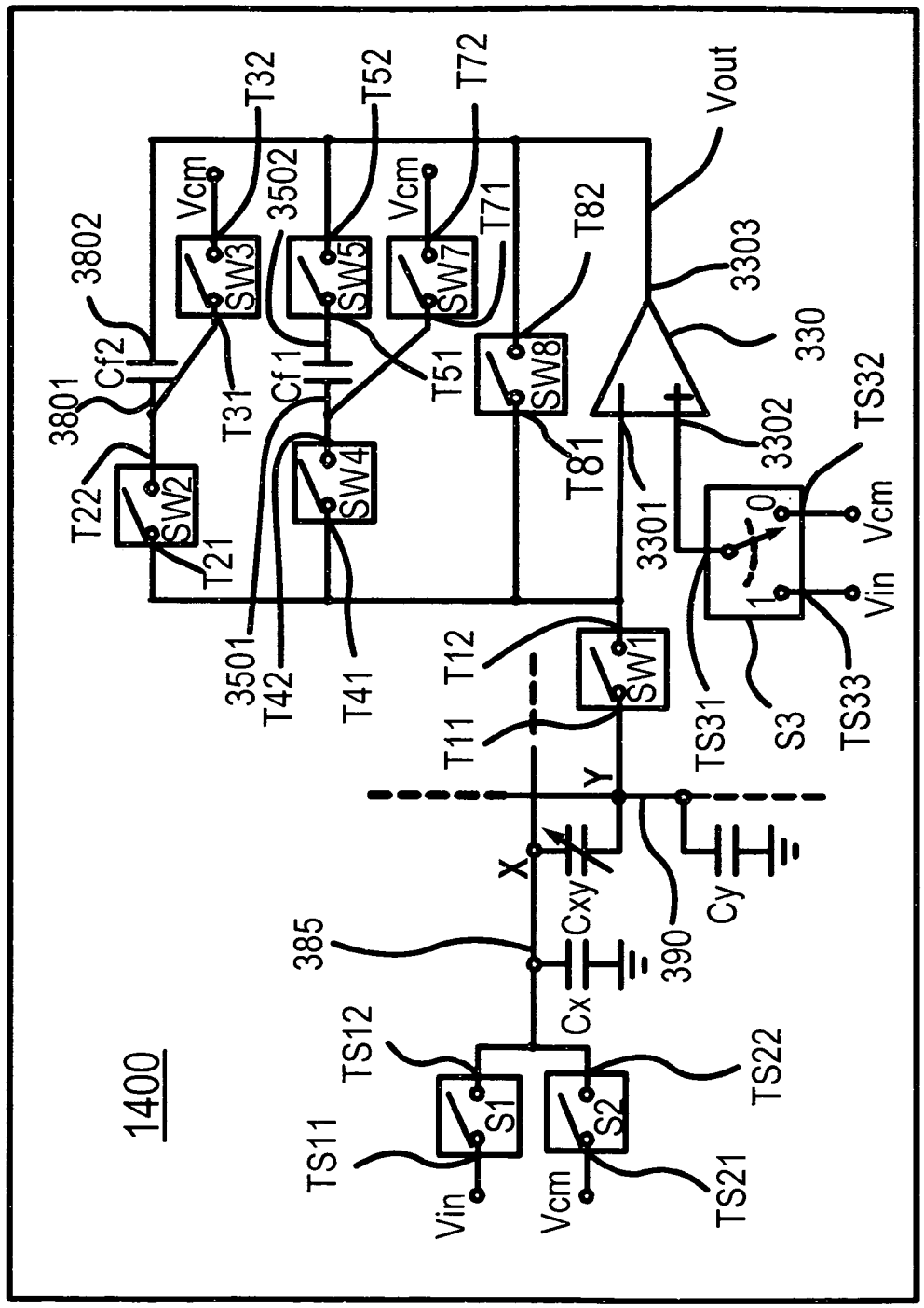
FIG. 14 is a block diagram of a sensing circuit for a touch panel according to a further embodiment of the invention.

FIG. 14 is a block diagram of a sensing circuit 1400 for a touch panel according to a third embodiment of the invention. In FIG. 14, the sensing circuit 1400 includes an input voltage source Vin, a first voltage switch S1, a common voltage source Vcm, a second voltage switch S2, a first switch SW1, an amplifier 330, a second switch SW2, a third switch SW3, a fourth switch SW4, a first feedback capacitor Cf1, a fifth switch SW5, a seventh switch SW7, an eighth switch SW8, a third voltage switch S3 and a second feedback capacitor Cf2.

The sensing circuit 1400 of FIG. 14 is similar to that of the FIG. 3 except that the sixth switch SW6 is removed. Namely, in this embodiment, the first voltage switch S1 has a first terminal TS11 connected to the input voltage source Vin and a second terminal TS12 connected to the first directional signal line 385. The second voltage switch S2 has a first terminal TS21 connected to the common voltage source Vcm and a second terminal TS22 connected to the first directional signal line 385. The first switch SW1 has a first terminal T11 connected to a second directional (Y-directional) signal line 390. The amplifier 330 has an inverting input terminal 3301 connected to a second terminal T12 of the first switch SW1. The second switch SW2 has a first terminal T21 connected to the inverting input terminal 3301 of the amplifier 330. The third switch SW3 has a first terminal T31 connected to a second terminal T22 of the second switch SW2 and a second terminal T32 connected to the common voltage source Vcm. The fourth switch SW4 has a first terminal T41 connected to the inverting input terminal 3301 of the amplifier 330. The first feedback capacitor Cf1 has a first terminal 3501 connected to a second terminal T42 of the fourth switch SW4. The fifth switch SW5 has a first terminal T51 connected to a second terminal 3502 of the first feedback capacitor Cf1 and a second terminal T52 connected to an output terminal 3303 of the amplifier 330. The seventh switch SW7 has a first terminal T71 connected to the second terminal T42 of the fourth switch SW4 and a second terminal T72 connected to the common voltage source Vcm. The eighth switch SW8 has a first terminal T81 connected to the inverting input terminal 3301 of the amplifier 330 and a second terminal T82 connected to the output terminal 3303 of the amplifier 330. The third voltage switch S3 has a first terminal TS31 connected to a non-inverting input terminal 3302 of the amplifier 330, a second terminal TS32 connected to the common voltage source Vcm and a third terminal TS33 connected to the input voltage source Vin. The second feedback capacitor Cf2 has a first terminal 3801 connected to the second terminal T22 of the second switch SW2 and a second terminal 3802 connected to the output terminal 3303 of the amplifier 330.

Figure 15:
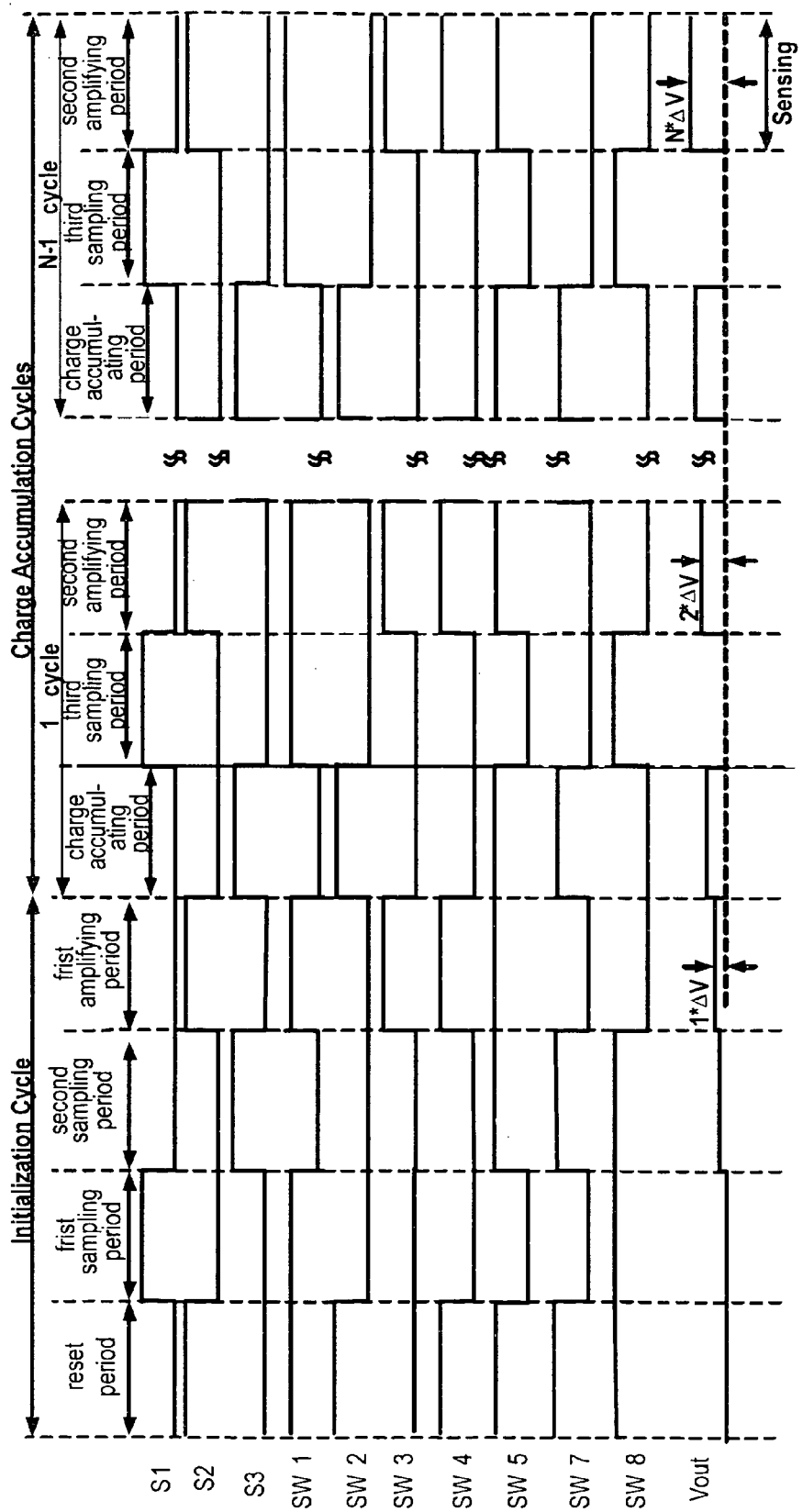
FIG. 15 is a timing of the sensing circuit of FIG. 14 according to a further embodiment of the invention.

FIG. 15 is a timing of the sensing circuit 1400 of FIG. 14 according to the third embodiment of the invention, which has an additional sampling period that is different from FIG. 4. In this embodiment, the timing includes an initialization cycle and multiple charge accumulation cycles. The initialization cycle includes a reset period, a first sampling period, a second sampling period and a first amplifying period. Each charge accumulation cycle includes a charge accumulating period, a third sampling period and a second amplifying period. The sensing circuit 1400 at the second amplifying period in the (N−1)-th charge accumulation cycle outputs an output voltage of N×ΔV through the output terminal 3303 of the amplifier 330, where $$\Delta V = Vin \times \frac{Cf1 + Cxy}{Cf1},$$

Vin indicates a voltage of the input voltage source (Vin), Cf1 indicates a capacitance value of the first feedback capacitor (Cf1), and Cxy indicates a capacitance value of the coupling capacitor (Cxy).

The circuit operation in the second and the third embodiments can be implemented by those skilled in the art in accordance with the timing of FIGS. 13 and 15. For example, the high voltage levels in the timing diagram indicate that the switches (SW1-SW8) or the voltage switches (S1-S3) are on, and conversely the low voltage levels indicate that the switches are off.

As cited, features of the invention are summarized as follows:

(1) The invention uses the first feedback capacitor Cf1, the second feedback capacitor Cf2, the first to eighth switches SW1-SW8 and the first to third voltage switches S1-S3 to change a typical sensing circuit, which can perform one time sampling only, into an improved sensing circuit which can accumulate and amplify the charges by switching the capacitors Cf1, Cf2 and the switches SW1-SW8 and S1-S3.

(2) The invention can obtain a higher feedback factor than the prior art to thereby allow the accumulated charge difference to be increased as the number of clock cycles increases.

(3) The invention allows the induced charges to be accumulated and increased by multiple times as the number of clock cycles increases.

(4) The invention further switches the first feedback capacitor Cf1, the second feedback capacitor Cf2, the first to eighth switches SW1-SW8 and the first to third voltage switches S1-S3 and uses virtual grounding of the amplifier 330 to exclude the sensing signal from being affected by the parasitic capacitance of the X or Y directional signal line in stacking the charge every time.

(5) The invention uses the feedback capacitors Cf1 and Cf2 to allow a smaller area in design and manufacture to thereby save the required area and reduce the power consumption of the chips.

Although the present invention has been explained in relation to its preferred embodiment, it is to be understood that many other possible modifications and variations can be made without departing from the spirit and scope of the invention as hereinafter claimed.

What is claimed is:

1. A touch panel, comprising:
   a touch panel sensing circuit for sensing a voltage variation of a coupling capacitor formed between a first directional signal line and a second directional signal line separated from the first directional signal line when an object approaches,
   wherein the touch panel sensing circuit comprises:
   an input voltage source for producing a plurality of periodic voltage cycles;
   a first voltage switch having a first terminal connected to the input voltage source and a second terminal connected to the first directional signal line;
   a common voltage source for providing a DC common voltage;
   a second voltage switch having a first terminal connected to the common voltage source and a second terminal connected to the first directional signal line;
   a first switch having a first terminal connected to the second directional signal line;
   an amplifier having an inverting input terminal connected to a second terminal of the first switch;
   a second switch having a first terminal connected to the inverting input terminal of the amplifier;
   a third switch having a first terminal connected to a second terminal of the second switch and a second terminal connected to the common voltage source;
   a fourth switch having a first terminal connected to the inverting input terminal of the amplifier;
   a first feedback capacitor having a first terminal connected to a second terminal of the fourth switch;
   a fifth switch having a first terminal connected to a second terminal of the first feedback capacitor and a second terminal connected to an output terminal of the amplifier;
   a sixth switch having a first terminal connected to the input voltage source and a second terminal connected to the second terminal of the first feedback capacitor;
   a seventh switch having a first terminal connected to the second terminal of the fourth switch and a second terminal connected to the common voltage source;
   an eighth switch having a first terminal connected to the inverting input terminal of the amplifier and a second terminal connected to the output terminal of the amplifier; and a third voltage switch having a first terminal connected to a non-inverting input terminal of the amplifier, a second terminal connected to the common voltage source and a third terminal connected to the input voltage source, and wherein the touch panel further comprises:

a first directional signal line switch for controlling a set of input voltage sources and a set of common voltage sources, wherein the set of input voltage sources provides the input voltage, and the set of common voltage sources provides the DC common voltage;

a first timing controller connected to the touch panel sensing circuit for controlling a timing of the touch panel sensing circuit;

a second timing controller connected to the first directional signal line switch for controlling a timing of the first directional signal line switch to provide the input and the common voltage sources, wherein the touch panel sensing circuit senses a second directional voltage, the first timing controller controls the first to eighth switches and the third voltage switch, and the second timing controller controls an input voltage of at least one first directional signal line, thereby producing a plurality of clock signals on the at least one first directional signal line and obtaining a plurality of accumulated voltage variations through the variations of the coupling capacitors respectively between the first and second directional signal lines;

an analog to digital converter (ADC) connected to the sensing circuit for converting the voltage variations into a digital code; and a digital signal processor connected to the ADC for determining whether an object approaches to touch the touch panel based on the digital code.

2. The touch panel sensing circuit as claimed in claim 1, wherein the sensing circuit forms a feedback loop to speed up charge accumulation by switching the first to eighth switches and the first to third voltage switches and using the first and the second feedback capacitors in an initialization cycle and multiple charge accumulation cycles.

3. The touch panel sensing circuit as claimed in claim 2, wherein the output terminal of the amplifier in a first charge accumulation cycle outputs a voltage of $\Delta V$, and the sensing circuit in an (N−1)-th charge accumulation cycle finally outputs a voltage of $N \times \Delta V$ through the output terminal of the amplifier, where $$\Delta V = Vin \times \frac{Cf1 + Cxy}{Cf1},$$

N is an integer greater than one, Vin indicates a voltage of the input voltage source, Cf1 indicates a capacitance value of the first feedback capacitor, and Cxy indicates a capacitance value of the coupling capacitor.

4. The touch panel sensing circuit as claimed in claim 2, wherein the initialization cycle comprises a reset period, a first sampling period and a first amplifying period, and each charge accumulation cycle comprises a charge accumulating period, a second sampling period and a second amplifying period.

5. The touch panel sensing circuit as claimed in claim 4, wherein, at the reset period, the first voltage switch is off, the second voltage switch is on, and the first terminal of the third voltage switch connects to the common voltage source, such that the first, second, fourth, fifth, seventh and eighth switches are on, and the third and sixth switches are off.

6. The touch panel sensing circuit as claimed in claim 5, wherein, at the first sampling period, the first voltage switch is on, the second voltage switch is off, and the first terminal of the third voltage switch connects to the common voltage source, such that the first, fourth, sixth and eighth switches are on, and the second, third, fifth and seventh switches are off.

7. The touch panel sensing circuit as claimed in claim 6, wherein, at the first amplifying period, the first voltage switch is off, the second voltage switch is on, and the first terminal of the third voltage switch connects to the common voltage source, such that the first, third, fourth and fifth switches are on, and the second, sixth, seventh and eighth switches are off.

8. The touch panel sensing circuit as claimed in claim 7, wherein, at the charge accumulating period, the first voltage switch is off, the second voltage switch is off, and the first terminal of the third voltage switch connects to the input voltage source, such that the second, fifth and seventh switches are on, and the first, third, fourth, sixth and eighth switches are off.

9. The touch panel sensing circuit as claimed in claim 8, wherein, at the second sampling period, the first voltage switch is on, the second voltage switch is off, and the first terminal of the third voltage switch connects to the common voltage source, such that the first and eighth switches are on, and the second to seventh switches are off.

10. The touch panel sensing circuit as claimed in claim 9, wherein, at the second amplifying period, the first voltage switch is off, the second voltage switch is on, and the first terminal of the third voltage switch connects to the common voltage source, such that the first, third, fourth and fifth switches are on, and the second, sixth, seventh and eighth switches are off.

11. A touch panel, comprising:

a touch panel sensing circuit for sensing a voltage variation of a coupling capacitor formed between a first directional signal line and a second directional signal line separated from the first directional signal line when an object approaches, wherein the touch panel sensing circuit comprises:

an input voltage source for producing a plurality of periodic voltage cycles;

a first voltage switch having a first terminal connected to the input voltage source and a second terminal connected to the first directional signal line;

a common voltage source for providing a DC common voltage;

a second voltage switch having a first terminal connected to the common voltage source and a second terminal connected to the first directional signal line;

a first switch having a first terminal connected to the second directional signal line;

an amplifier having an inverting input terminal connected to a second terminal of the first switch;

a second switch having a first terminal connected to the inverting input terminal of the amplifier;

a third switch having a first terminal connected to a second terminal of the second switch and a second terminal connected to the common voltage source;

a fourth switch having a first terminal connected to the inverting input terminal of the amplifier;

a first feedback capacitor having a first terminal connected to a second terminal of the fourth switch;

a fifth switch having a first terminal connected to a second terminal of the first feedback capacitor and a second terminal connected to an output terminal of the amplifier;

a sixth switch having a first terminal connected to the first directional signal line and a second terminal connected to the second terminal of the first feedback capacitor;

a seventh switch having a first terminal connected to the second terminal of the fourth switch and a second terminal connected to the common voltage source;

an eighth switch having a first terminal connected to the inverting input terminal of the amplifier and a second terminal connected to the output terminal of the amplifier; and a third voltage switch having a first terminal connected to a non-inverting input terminal of the amplifier, a second terminal connected to the common voltage source and a third terminal connected to the input voltage source, and wherein the touch panel further comprises:

a first directional signal line switch for controlling a set of input voltage sources and a set of common voltage sources, wherein the set of input voltage sources provides the input voltage and the set of common voltage sources provides the DC common voltage;

a first timing controller connected to the touch panel sensing circuit for controlling a timing of the touch panel sensing circuit;

a second timing controller connected to the first directional signal line switch for controlling a timing of the first directional signal line switch to provide the input and the common voltage sources, wherein the sensing circuit senses a second directional voltage, the first timing controller controls the first to eighth switches and the third voltage switch, and the second timing controller controls an input voltage of at least one first directional signal line, thereby producing a plurality of clock signals on the at least one first directional signal line and obtaining a plurality of accumulated voltage variations through the variations of the coupling capacitors respectively between the first and second directional signal lines;

an analog to digital converter connected to the sensing circuit for converting the voltage variations into a digital code; and a digital signal processor connected to the analog to digital converter for determining whether an object approaches to touch the touch panel according to the digital code.

12. The touch panel sensing circuit as claimed in claim 11, wherein the sensing circuit forms a feedback loop to speed up charge accumulation by switching the first to eighth switches and the first to third voltage switches and using the first and the second feedback capacitors in an initialization cycle and multiple charge accumulation cycles.

13. The touch panel sensing circuit as claimed in claim 12, wherein the output terminal of the amplifier in a first charge accumulation cycle outputs a voltage of $\Delta V$, and the sensing circuit in an (N−1)-th charge accumulation cycle finally outputs a voltage of $N \times \Delta V$ through the output terminal of the amplifier, where $$\Delta V = Vin \times \frac{Cf1 + Cxy}{Cf1},$$

N is an integer greater than one, Vin indicates a voltage of the input voltage source, Cf1 indicates a capacitance value of the first feedback capacitor, and Cxy indicates a capacitance value of the coupling capacitor.

14. The touch panel sensing circuit as claimed in claim 12, wherein the initialization cycle comprises a reset period, a first sampling period and a first amplifying period, and each charge accumulation cycle comprises a charge accumulating period, a second sampling period and a second amplifying period.

15. The touch panel sensing circuit as claimed in claim 14, wherein, at the reset period, the first voltage switch is off, the second voltage switch is on, and the first terminal of the third voltage switch connects to the common voltage source, such that the first, second, fourth, fifth, sixth, seventh and eighth switches are on, and the third switch is off.

16. The touch panel sensing circuit as claimed in claim 15, wherein, at the first sampling period, the first voltage switch is on, the second voltage switch is off, and the first terminal of the third voltage switch connects to the common voltage source, such that the first, fourth, sixth and eighth switches are on, and the second, third, fifth and seventh switches are off.

17. The touch panel sensing circuit as claimed in claim 16, wherein, at the first amplifying period, the first voltage switch is off, the second voltage switch is on, and the first terminal of the third voltage switch connects to the common voltage source, such that the first, third, fourth and fifth switches are on, and the second, sixth, seventh and eighth switches are off.

18. The touch panel sensing circuit as claimed in claim 17, wherein, at the charge accumulating period, the first voltage switch is off, the second voltage switch is off, and the first terminal of the third voltage switch connects to the input voltage source, such that the second, fifth and seventh switches are on, and the first, third, fourth, sixth and eighth switches are off.

19. The touch panel sensing circuit as claimed in claim 18, wherein, at the second sampling period, the first voltage switch is on, the second voltage switch is off, and the first terminal of the third voltage switch connects to the common voltage source, such that the first and eighth switches are on, and the second to seventh switches are off.

20. The touch panel sensing circuit as claimed in claim 19, wherein, at the second amplifying period, the first voltage switch is off, the second voltage switch is on, and the first terminal of the third voltage switch connects to the common voltage source, such that the first, third, fourth and fifth switches are on, and the second, sixth, seventh and eighth switches are off.

21. A touch panel, comprising:

a touch panel sensing circuit for sensing a voltage variation of a coupling capacitor formed between a first directional signal line and a second directional signal line separated from the first directional signal line when an object approaches, wherein the touch panel sensing circuit comprises:

an input voltage source for producing a plurality of periodic voltage cycles;

a first voltage switch having a first terminal connected to the input voltage source and a second terminal connected to the first directional signal line;

a common voltage source for providing a DC common voltage;

a second voltage switch having a first terminal connected to the common voltage source and a second terminal connected to the first directional signal line;

a first switch having a first terminal connected to the second directional signal line;

an amplifier having an inverting input terminal connected to a second terminal of the first switch;

a second switch having a first terminal connected to the inverting input terminal of the amplifier;

a third switch having a first terminal connected to a second terminal of the second switch and a second terminal connected to the common voltage source;

a fourth switch having a first terminal connected to the inverting input terminal of the amplifier;

a first feedback capacitor having a first terminal connected to a second terminal of the fourth switch;

a fifth switch having a first terminal connected to a second terminal of the first feedback capacitor and a second terminal connected to an output terminal of the amplifier;

a seventh switch having a first terminal connected to the second terminal of the fourth switch and a second terminal connected to the common voltage source;

an eighth switch having a first terminal connected to the inverting input terminal of the amplifier and a second terminal connected to the output terminal of the amplifier; and a third voltage switch having a first terminal connected to a non-inverting input terminal of the amplifier, a second terminal connected to the common voltage source and a third terminal connected to the input voltage source, and wherein the touch panel further comprises:

a first directional signal line switch for controlling a set of input voltage sources and a set of common voltage sources, wherein the set of input voltage sources provides the input voltage, and the set of common voltage sources provides the DC common voltage;

a first timing controller connected to the touch panel sensing circuit for controlling a timing of the touch panel sensing circuit;

a second timing controller connected to the first directional signal line switch for controlling a timing of the first directional signal line switch to provide the input and the common voltage sources, wherein the touch panel sensing circuit senses a second directional voltage, the first timing controller controls the first to eighth switches and the third voltage switch, and the second timing controller controls an input voltage of at least one first directional signal line, thereby producing a plurality of clock signals on the at least one first directional signal line and obtaining a plurality of accumulated voltage variations through the variations of the coupling capacitors respectively between the first and second directional signal lines;

an analog to digital converter (ADC) connected to the sensing circuit for converting the voltage variations into a digital code; and a digital signal processor connected to the ADC for determining whether an object approaches to touch the touch panel based on the digital code.

22. The touch panel sensing circuit as claimed in claim 21, wherein the sensing circuit forms a feedback loop to speed up charge accumulation by switching the first to fifth and seventh to eighth switches and the first to third voltage switches and using the first and the second feedback capacitors in an initialization cycle and multiple charge accumulation cycles.

23. The touch panel sensing circuit as claimed in claim 22, wherein the output terminal of the amplifier in a first charge accumulation cycle outputs a voltage of ΔV, and the sensing circuit in an (N−1)th charge accumulation cycle finally outputs a voltage of N×ΔV through the output terminal of the amplifier, where $$\Delta V = Vin \times \frac{Cf1 + Cxy}{Cf1},$$

N is an integer greater than one, Vin indicates a voltage of the input voltage source, Cf1 indicates a capacitance value of the first feedback capacitor, and Cxy indicates a capacitance value of the coupling capacitor.

24. The touch panel sensing circuit as claimed in claim 22, wherein the initialization cycle comprises a reset period, a first sampling period, a second sampling period and a first amplifying period, and each charge accumulation cycle comprises a charge accumulating period, a third sampling period and a second amplifying period.

25. The touch panel sensing circuit as claimed in claim 24, wherein at the reset period, the first voltage switch is off, the second voltage switch is on, and the first terminal of the third voltage switch connects to the common voltage source, such that the first, second, fourth, fifth, seventh and eighth switches are on, and the third switch is off.

26. The touch panel sensing circuit as claimed in claim 25, wherein at the first sampling period, the first voltage switch is on, the second voltage switch is off, and the first terminal of the third voltage switch connects to the common voltage source, such that the first and eighth switches are on, and the second, third, fourth, fifth and seventh switches are off.

27. The touch panel sensing circuit as claimed in claim 26, wherein at the second sampling period, the first voltage switch is off, the second voltage switch is off, and the first terminal of the third voltage switch connects to the input voltage source, such that the fifth, seventh and eighth switches are on, and the first to fourth switches are off.

28. The touch panel sensing circuit as claimed in claim 27, wherein at the first amplifying period, the first voltage switch is off, the second voltage switch is on, and the first terminal of the third voltage switch connects to the common voltage source, such that the first, third, fourth and fifth switches are on, and the second, seventh and eighth switches are off.

29. The touch panel sensing circuit as claimed in claim 28, wherein at the charge accumulating period, the first voltage switch is off, the second voltage switch is off, and the first terminal of the third voltage switch connects to the input voltage source, such that the second, fifth and seventh switches are on, and the first, third, fourth and eighth switches are off.

30. The touch panel sensing circuit as claimed in claim 29, wherein at the third sampling period, the first voltage switch is on, the second voltage switch is off, and the first terminal of the third voltage switch connects to the common voltage source, such that the first and eighth switches are on, and the second, third, fourth, fifth and seventh switches are off.

31. The touch panel sensing circuit as claimed in claim 30, wherein at the second amplifying period, the first voltage switch is off, the second voltage switch is on, and the first terminal of the third voltage switch connects to the common voltage source, such that the first, third, fourth and fifth switches are on, and the second, seventh and eighth switches are off.

* * * * *